United States Patent
Khayat et al.

(10) Patent No.: US 11,587,624 B2
(45) Date of Patent: Feb. 21, 2023

(54) COARSE CALIBRATION BASED ON SIGNAL AND NOISE CHARACTERISTICS OF MEMORY CELLS COLLECTED IN PRIOR CALIBRATION OPERATIONS

(71) Applicant: Micron Technology, Inc., Boise, ID (US)

(72) Inventors: Patrick Robert Khayat, San Diego, CA (US); James Fitzpatrick, Laguna Niguel, CA (US); AbdelHakim S. Alhussien, San Jose, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/675,614

(22) Filed: Feb. 18, 2022

(65) Prior Publication Data
US 2022/0172787 A1 Jun. 2, 2022

Related U.S. Application Data

(63) Continuation of application No. 16/988,353, filed on Aug. 7, 2020, now Pat. No. 11,276,473.

(51) Int. Cl.
*G11C 16/26* (2006.01)
*G06N 20/00* (2019.01)
*G06F 11/10* (2006.01)
*G06F 3/06* (2006.01)
(Continued)

(52) U.S. Cl.
CPC .............. *G11C 16/26* (2013.01); *G06F 3/061* (2013.01); *G06F 3/0659* (2013.01); *G06F 3/0679* (2013.01); *G06F 11/1068* (2013.01); *G06N 20/00* (2019.01); *G11C 16/10* (2013.01); *G11C 16/0483* (2013.01)

(58) Field of Classification Search
CPC ..... G11C 16/26; G11C 16/10; G11C 16/0483; G06N 20/00; G06F 3/061; G06F 3/0659; G06F 3/0679; G06F 11/1068
See application file for complete search history.

(56) References Cited

U.S. PATENT DOCUMENTS

| 10,199,111 B1 | 2/2019 | Besinga et al. |
| 11,276,473 B2 | 3/2022 | Khayat et al. |

(Continued)

OTHER PUBLICATIONS

Jiajing Wang, A. Singhee, R. A. Rutenbar and B. H. Calhoun, "Statistical modeling for the minimum standby supply voltage of a full SRAM array," ESSCIRC 2007—33rd European Solid-State Circuits Conference, 2007, pp. 400-403, doi: 10.1109/ESSCIRC.2007.4430327. (Year: 2007).*

*Primary Examiner* — William E. Baughman
*Assistant Examiner* — Janice M. Girouard
(74) *Attorney, Agent, or Firm* — Greenberg Traurig

(57) ABSTRACT

A memory device to perform a calibration of read voltages of a group of memory cells. For example, the memory device can measure signal and noise characteristics of a group of memory cells to determine an optimized read voltage of the group of memory cells and determine an amount of accumulated storage charge loss in the group of memory cells. Subsequently, the memory device can perform a read voltage calibration based on the determined amount of accumulated storage charge loss and a look up table.

20 Claims, 9 Drawing Sheets

(51) Int. Cl.
*G11C 16/10* (2006.01)
*G11C 16/04* (2006.01)

(56) References Cited

U.S. PATENT DOCUMENTS

| | | |
|---|---|---|
| 2006/0164898 A1* | 7/2006 | Pio .................... G11C 29/026 365/210.1 |
| 2008/0062762 A1 | 3/2008 | Doyle |
| 2010/0027337 A1 | 2/2010 | Park |
| 2012/0084490 A1 | 4/2012 | Choi et al. |
| 2013/0094289 A1 | 4/2013 | Sridharan et al. |
| 2019/0043590 A1 | 2/2019 | Besinga et al. |
| 2019/0295671 A1 | 9/2019 | Bang et al. |
| 2022/0044737 A1 | 2/2022 | Khayat et al. |

* cited by examiner

COARSE CALIBRATION BASED ON SIGNAL AND NOISE CHARACTERISTICS OF MEMORY CELLS COLLECTED IN PRIOR CALIBRATION OPERATIONS

RELATED APPLICATIONS

The present application is a continuation application of U.S. patent application Ser. No. 16/988,353 filed Aug. 7, 2020, the entire disclosures of which application are hereby incorporated herein by reference.

TECHNICAL FIELD

At least some embodiments disclosed herein relate to memory systems in general, and more particularly, but not limited to memory systems configured to determine voltages for reading data from memory cells.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
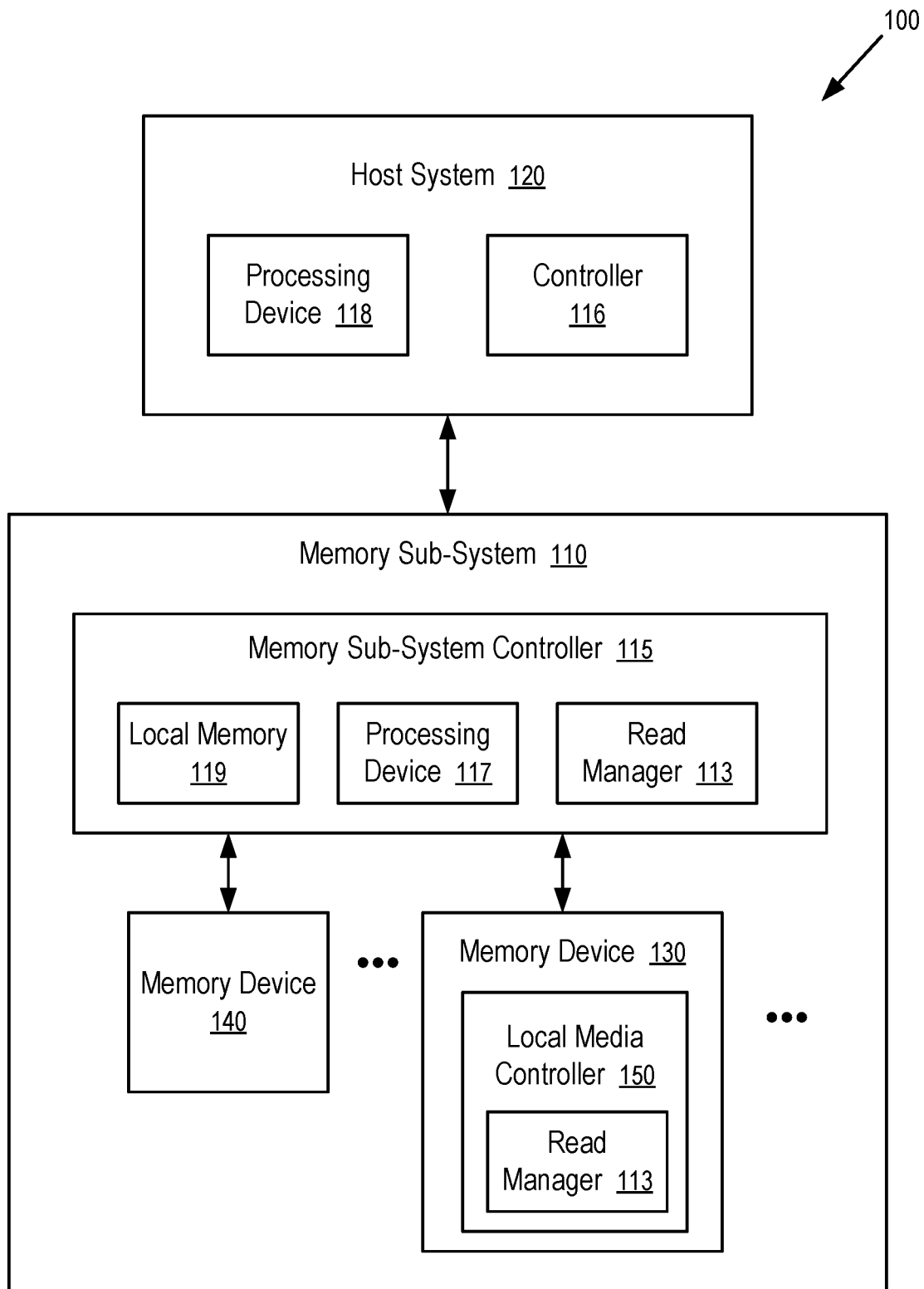
FIG. 1 illustrates an example computing system having a memory sub-system in accordance with some embodiments of the present disclosure.

At least some aspects of the present disclosure are directed to a memory sub-system configured to track storage charge loss (SCL) based on signal and noise characteristics measured during calibrations of read voltages of the group of memory cells and use the tracked storage charge loss (SCL) to estimate read voltages in subsequent calibrations. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

An integrated circuit memory cell (e.g., a flash memory cell) can be programmed to store data by the way of its state at a threshold voltage. For example, if the memory cell is configured/programmed in a state that allows a substantial current to pass the memory cell at the threshold voltage, the memory cell is storing a bit of one; and otherwise, the memory cell is storing a bit of zero. Further, a memory cell can store multiple bits of data by being configured/programmed differently at multiple threshold voltages. For example, the memory cell can store multiple bits of data by having a combination of states at the multiple threshold voltages; and different combinations of the states of the memory cell at the threshold voltages can be interpreted to represent different states of bits of data that is stored in the memory cell.

However, after the states of integrated circuit memory cells are configured/programmed using write operations to store data in the memory cells, the optimized threshold voltage for reading the memory cells can shift due to a number of factors, such as charge loss, read disturb, cross-temperature effect (e.g., write and read at different operating temperatures), etc., especially when a memory cell is programmed to store multiple bits of data.

Data can be encoded with redundant information to facilitate error detection and recovery. When data encoded with redundant information is stored in a memory sub-system, the memory sub-system can detect errors in raw, encoded data retrieved from the memory sub-system and/or recover the original, non-encoded data that is used to generate encoded data for storing in the memory sub-system. The recovery operation can be successful (or have a high probability of success) when the raw, encoded data retrieved from the memory sub-system contains less than a threshold amount of errors, or the bit error rate in the encoded data is lower than a threshold. For example, error detection and data recovery can be performed using techniques such as Error Correction Code (ECC), Low-Density Parity-Check (LDPC) code, etc.

When the encoded data retrieved from the memory cells of the memory sub-system has too many errors for successful decoding, the memory sub-system may retry the execution of the read command with adjusted parameters for reading the memory cells. However, it is inefficient to search for a set of parameters through multiple read retry with multiple rounds of calibration, reading, decoding failure, and retry, until the encoded data retrieved from the memory cells can be decoded into error free data. For example, blind searching for the optimized read voltages is inefficient. For example, one or more commands being injected between retry reads can lead to long latency for recovering data from errors.

Conventional calibration circuitry has been used to self-calibrate a memory region in applying read level signals to account for shift of threshold voltages of memory cells within the memory region. During the calibration, the calibration circuitry is configured to apply different test signals to the memory region to count the numbers of memory cells that output a specified data state for the test signals. Based on the counts, the calibration circuitry determines a read level offset value as a response to a calibration command.

At least some aspects of the present disclosure address the above and other deficiencies by determining an amount of accumulated storage charge loss (SCL) in a group of memory cells from signal and noise characteristics of memory cells measured during calibration of the optimized read voltages of the group of memory cells, and tracking the amount of accumulated storage charge loss (SCL) to determine estimates of optimized read voltages as a starting point in a subsequent calibration of the optimized read voltages of the group of memory cells, or another group of memory cells.

Storage charge loss (SCL) can cause the optimized read voltages of a memory cell to shift in a systematic way. In the absence of other factors that cause shifts or changes in the optimized read voltages of the memory cell, the amount of accumulated storage charge loss (SCL) in a group of memory cells correlates with the highest threshold voltage and the optimized read voltages at different levels for reading a memory cell that is programmed to store multiple bits data.

Based on the correlation between the highest threshold voltage and shifts in the optimized read voltages at different levels (e.g., caused by accumulated storage charge loss (SCL)), a look up table can be configured to provide estimates of optimized read voltages at the different levels for reading the memory cell based on an estimate of the range of the highest threshold voltage. The estimates of the optimized read voltages determined in such a way can be used as the result of a coarse calibration of the read voltages of the memory cell. A fine calibration can be performed to capture further shifts in optimized read voltages that may be caused by other factors, such as read disturb, cross-temperature effect, etc.

The highest threshold voltage in a memory group can be estimated during a read sensing operation in a memory device. For example, a memory device can measure dynamic VpassR of a memory block by sensing, during the ramping of voltages on wordlines to the VpassR voltage to allow the bitline to conduct, the lowest voltage that causes current to be drawn from the bitline. This lowest voltage, measured as dynamic VpassR, represents the highest threshold voltage in the block and thus an estimate of the highest threshold voltage of the memory group in the block. However, such an estimate can be inaccurate in many circumstances. For example, when a block is written over the course of a long period of time (e.g., an hour), different groups of memory cells can have different shifts in their highest threshold voltages, since the shifts depend upon when the word line in the block is written. Thus, the memory device may not be able to accurately sense the highest threshold voltage of a group of memory cells.

In at least some embodiments disclosed herein, the highest threshold voltage is estimated based on signal and noise characteristics measured during the fine calibration of the optimized read voltages. For example, the signal and noise characteristics are used to calculate the amount of accumulated storage charge loss (SCL) and thus the highest threshold voltage.

For a given estimate of an optimized read voltage, a memory device can automatically perform a fine calibration of the optimized read voltage by measuring signal and noise characteristics of a group of memory cells. The signal and noise characteristics measured for memory cells can be based on a bit count of memory cells in the group having a predetermined status when a test voltage is applied to read the memory cells. Different test voltages near the given estimate of the optimized read voltage and separated from one another by a predetermined voltage interval or gap can have different bit counts. The difference between bit counts of two adjacent test voltages provides the count difference for the voltage interval or gap between the adjacent test voltages. An optimized read voltage can be found at a voltage where the distribution of the count differences over voltage reaches a minimum.

To improve efficiency and accuracy, the range of the test voltages is typically configured to be small in comparison to the possible range of the optimized read voltage. To increase the chance that the optimized read voltage to be determined is located within the test voltage range, the test voltage range for measuring the signal and noise characteristics in the determination of the fine calibration of the optimized read voltage is configured to be centered at the given estimate of the optimized read voltage (e.g., the coarse calibration of the optimized read voltage). Such a coarse calibration can be determined, for example, from the look up table based on the estimate of the highest threshold voltage.

The signal and noise characteristics measured during a fine calibration can further include erased page check (EPC). An erased page check (EPC) measured for an optimized read voltage identifies a count of the population of memory cells whose threshold voltages are greater than the optimized read voltage. The erased page check (EPC) can be used as an indicator of whether the optimized read voltage is approximately in a correct region globally in voltage, because statistically the ratio of the population of memory cells whose read voltages are greater than the optimized read voltage in the entire group of memory cells is expected to be within a known range.

A predictive model can be used to compute/estimate/predict the accumulated storage charge loss (SCL) in the group of memory cells based on the signal and noise characteristics, such as the count differences measured in the test voltage range and the erased page check (EPC). The predictive model can be obtained using a machine learning technique, or another technique, such as statistical analysis, correlation, classification tree, etc. The predictive model is configured to compute an estimated amount of accumulated storage charge loss (SCL) from the count differences measured for the highest read voltage (e.g., the read voltage at the highest level of reading the group of memory cells), and the erased page check (EPC) measured for the highest read voltage. Optionally, the predictive model can also be constructed to compute the estimated amount of accumulated storage charge loss (SCL) from count differences and erased page check (EPC) measured at one or more other levels of voltages for reading the group of memory cells.

The estimated amount of accumulated storage charge loss (SCL) can be used to determine a range of the highest threshold voltage. The memory device can use a look up table to perform a coarse calibration by looking up the estimates of optimized read voltages at different levels corresponding to the range of the highest threshold voltage.

The highest threshold voltage estimated using the predictive model of accumulated storage charge loss (SCL) can be used as a replacement of the highest threshold voltage determined during a read sensing operation in the memory device (e.g., dynamic VpassR), especially in circumstances when the result of such sensing is inaccurate.

For example, when an initial iteration of calibrations is determined to have mis-calibrated an optimized read voltage into a wrong region globally, the estimated amount of accumulated storage charge loss (SCL) determined from the predictive model can be used to adjust the coarse calibration such that the coarse estimates of the optimized read voltages can position the test voltage ranges in correct regions globally and/or near the actual locations of the optimized read voltages.

For example, the estimated amount of accumulated storage charge loss (SCL) can be tracked in association with the identification of the group of the memory cells such that when the group of the memory cells is to be calibrated subsequently, the estimated accumulated storage charge loss (SCL) can be used to perform the coarse calibration for the group of memory cells.

For example, the estimated amount of accumulated storage charge loss (SCL) can be tracked in association with the time gap between the last write of the group of memory cells and the fine calibration such that another group of memory cells with a similar length of time gap can use the estimated amount of accumulated storage charge loss (SCL) to perform a coarse calibration.

For example, a predictive model can be used established based on amount of accumulated storage charge loss and time period responsible for the accumulated storage charge loss. For an estimated amount of accumulated storage charge loss determined from signal and noise characteristics measured during a fine calibration, such a time period can be determined from the difference between the time of the latest write operation performed on the group of memory cells and the time of the fine calibration. For a given time period between the last write and current calibration and the temperature history during the time period, such a predictive model can be used to predict the amount of accumulated storage charge loss for a coarse calibration.

After count differences are measured on a test voltage range, the memory device can calculate an optimized read voltage from the count differences in the test voltage range.

For example, when one of the count differences in the test voltage range is smaller than its two adjacent neighbors, the minimum corresponding to the optimized read voltage can be considered to be in the voltage interval or gap of the smallest count difference. An improved location of the optimized read voltage within the gap can be computed based on a ratio of adjacent neighbors, as further discussed below in connection with FIG. 5.

For example, when no count difference is between two higher adjacent neighbors in a test voltage range, the optimized read voltage can be identified as in a voltage interval or gap corresponding to a count difference that is smaller than two of the next two count differences. An improved location of the optimized read voltage within the gap can be computed based on a ratio of bit counts at the test voltages of the two ends of the gap, as further discussed below in connection with FIG. 6.

After an optimized read voltage is calculated (e.g., using techniques illustrated in FIGS. 3-6), the memory device can use the optimized read voltage to read memory cells and obtain hard bit data, and optionally boost modulating the applied read voltage(s) to adjacent voltages to further read the memory cells for soft bit data.

Preferably, the operations of reading the hard bit data and reading the soft bit data are scheduled together during the execution of the read command to minimize the time required to obtain the soft bit data and/or to avoid delay that can be caused by processing a separate read command, or by intervening operations on the memory cells.

Optionally, the signal and noise characteristics measured for memory cells are further used to evaluate the quality of the hard bit data retrieved using the calibrated read voltage(s). The evaluation can be performed at least in part concurrently with the reading of the hard bit data. Based on the evaluated quality of the hard bit data, the memory device may selectively read and/or transmit the soft bit data.

The hard bit data retrieved from a group of memory cells using the calibrated/optimized read voltage can be decoded using an error detection and data recovery technique, such as Error Correction Code (ECC), Low-Density Parity-Check (LDPC) code, etc. When the error rate in the hard bit data is high, the soft bit data, retrieved from the memory cell using read voltages with predetermined offsets from the calibrated/optimized read voltage, can be used to assist the decoding of the hard bit data. When the soft bit data is used, the error recovery capability is improved in decoding the hard bit data.

Optionally, a controller of a memory sub-system can initially send a command to a memory device to read hard bit data with calibrated read voltage; and in response to a failure in the decoding of the hard bit data, the controller can further send a command to the memory device to read the corresponding soft bit data. Such an implementation is efficient when the likelihood of a failure in decoding the hard bit data without soft bit data is lower than a threshold. However, when the likelihood is above the threshold, the overhead of sending the separate command becomes disadvantageous.

When the likelihood of using soft bit data is above a threshold, it is advantageous to transmit a single command to the memory device to cause the memory device to read the soft bit data and the hard bit data together. Further, the memory device can use the signal and noise characteristics of the memory cells to predict whether the soft bit data is likely to be used by the controller. If the likelihood of using of the soft bit data is lower than a threshold, the memory device can skip reading the soft bit data.

For example, during the calibration operation, the memory device can measure the signal and noise characteristics of the memory cells and use the measurements to calculate an optimized/calibrated read voltage for reading the memory cells. Once the optimized/calibrated read voltage is obtained, the memory device reads the memory cells to obtain the hard bit data. Subsequently, the memory device adjusts the already applied optimized/calibrated read voltage (e.g., through boosted modulation) to a predetermined offset (e.g., 50 mV) below the optimized/calibrated read voltage to retrieve a set of data, and further adjusts the currently applied voltage (e.g., through boosted modulation) to the predetermined offset above the optimized/calibrated read voltage to retrieve another set of data. The logic operation of XOR (exclusive or) of the two sets of data at both sides of the offset (e.g., 50 mV) from the optimized/calibrated read voltage provides the indication of whether the memory cells provide the same reading at the offset locations around the optimized/calibrated read voltage. The result of the XOR operation can be used as soft bit data for decoding the hard bit data read using the optimized/calibrated read voltage. In some implementations, a larger offset (e.g., 90 mV) can be used to read another set of soft bit data that indicates whether the memory cells provide the same reading at the locations according to the larger offset (e.g., 90 mV) around the optimized/calibrated read voltage.

For example, in response to a read command from a controller of the memory sub-system, a memory device of the memory sub-system performs an operation to calibrate a read voltage of memory cells. The calibration is performed by measuring signal and noise characteristics through reading the memory cells at a number of voltage levels that are near an estimated location of the optimized read voltage. An optimized read voltage can be calculated based on statistical data of the results generated from reading the memory cells at the voltage levels. For example, the statistical data can include and/or can be based on counts measured by calibration circuitry at the voltage levels. Optionally, such signal and noise characteristics can be measured for sub-regions in parallel to reduce the total time for measuring the signal and noise characteristics. The statistical data of the results generated from reading the memory cells at the voltage levels can be used to predict whether the decoding of the hard bit data retrieved using the optimized read voltage is likely to require the use of soft bit data for successful decoding. Thus, the transmission of the soft bit data can be performed selectively based on the prediction.

For example, a predictive model can be generated through machine learning to estimate or evaluate the quality of data that can be retrieved from a set of memory cells using the calibrated/optimized read voltage(s). The predictive model can use features calculated from the measured signal and noise characteristics of the memory cells as input to generate a prediction. The reading and/or transmission of the soft bit data can be selectively skipped based on the prediction.

After the memory device reads the group of memory cells at the highest level using the optimized read voltage determined from the count differences measured in a test voltage centered at a highest estimate of the read voltages of the group of memory cells, the memory device can count the number of memory cells having threshold voltages that are higher than the optimized read voltage used to read the group of memory cells at the highest level. The cell count (or its ratio in the entire population in the group of memory cells) and the count differences measured for the highest level (and optionally, similar measurements obtained at other levels) can be used in a predictive model to estimate/compute/predict the amount of accumulated storage charge loss (SCL), which can be tracked for a subsequent coarse calibration of read voltages.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an Internet of Things (IoT) enabled device, am embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel, a Serial Attached SCSI (SAS) interface, a double data rate (DDR) memory bus interface, a Small Computer System Interface (SCSI), a dual in-line memory module (DIMM) interface (e.g., DIMM socket interface that supports Double Data Rate (DDR)), an Open NAND Flash Interface (ONFI), a Double Data Rate (DDR) interface, a Low Power Double Data Rate (LPDDR) interface, or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from memory sub-system 110 into information for the host system 120.

The controller 116 of the host system 120 can communicate with controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 150) for media management within the same memory device package. An example of a managed memory device is a managed NAND (MNAND) device.

The controller 115 and/or a memory device 130 can include a read manager 113 configured to estimate an amount of accumulated storage charge loss (SCL) in a group of memory cells using signal and noise characteristics of the group of memory cells measured during the calibration of an optimized read voltage of the group of memory cells and track the estimate accumulated storage charge loss to estimate optimized read voltages in a subsequent calibration. In some embodiments, the controller 115 in the memory sub-system 110 includes at least a portion of the read manager 113. In other embodiments, or in combination, the controller 116 and/or the processing device 118 in the host system 120 includes at least a portion of the read manager 113. For example, the controller 115, the controller 116, and/or the processing device 118 can include logic circuitry implementing the read manager 113. For example, the controller 115, or the processing device 118 (processor) of the host system 120, can be configured to execute instructions stored in memory for performing the operations of the read manager 113 described herein. In some embodiments, the read manager 113 is implemented in an integrated circuit chip disposed in the memory sub-system 110. In other embodiments, the read manager 113 can be part of firmware of the memory sub-system 110, an operating system of the host system 120, a device driver, or an application, or any combination therein.

For example, the read manager 113 implemented in the controller 115 can transmit a read command or a calibration command to the memory device 130. In response to such a command, the read manager 113 implemented in the memory device 130 is configured to measure signal and noise characteristics of a group of memory cells by reading the group of memory cells at a plurality of test voltages configured near an estimated location of the optimized read voltage for the group of memory cells. The test voltages can be configured to be equally spaced by a same amount of voltage gap. A result of reading the group of memory cells at a test voltage determines a bit count of memory cells in the group that are determined to be storing or reporting a predetermined bit (e.g., 0 or 1 corresponding to memory cells being conductive or non-conductive at the test voltage) when the group is read at the test voltage. A count difference can be computed from the bit counts of each pair of adjacent test voltages. Based on the count differences measured in the test voltage range, the read manager 113 computes an optimized read voltage for reading hard bit data from the group of memory cells and optionally determines a voltage window for reading corresponding soft bit data for the decoding of the hard bit data. When the memory device 130 reads the group of memory cells at the optimized read voltage, the memory device 130 measures erased page check (EPC) that identifies, in the group of memory cells, the count of memory cells whose threshold voltage is greater than the optimized read threshold. Based on the count differences over the test voltage range and the erased page check (EPC), the read manager 113 computes the amount of accumulated storage charge loss (SCL) in the group of memory cells and an identification of a range of highest threshold voltage in the group of memory cells. The range identification can be used in a look up table to determine estimates of optimized read voltages. The estimates from the look up table can be used to configure test voltage ranges for the calibrations of the optimized read voltages.

Figure 2:
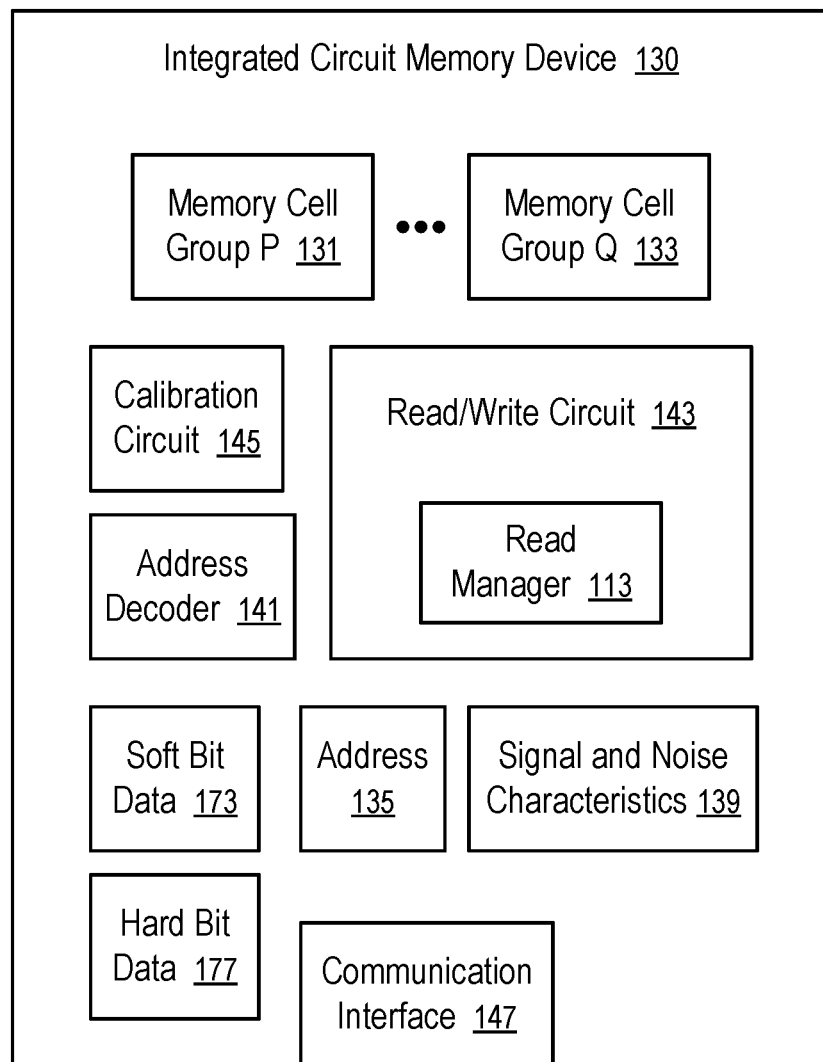
FIG. 2 illustrates an integrated circuit memory device having a calibration circuit configured to measure signal and noise characteristics according to one embodiment.

FIG. 2 illustrates an integrated circuit memory device 130 having a calibration circuit 145 configured to measure signal and noise characteristics according to one embodiment. For example, the memory devices 130 in the memory sub-system 110 of FIG. 1 can be implemented using the integrated circuit memory device 130 of FIG. 2.

The integrated circuit memory device 130 can be enclosed in a single integrated circuit package. The integrated circuit memory device 130 includes multiple groups 131, . . . , 133 of memory cells that can be formed in one or more integrated circuit dies. A typical memory cell in a group 131, . . . , 133 can be programmed to store one or more bits of data.

Some of the memory cells in the integrated circuit memory device 130 can be configured to be operated together for a particular type of operations. For example, memory cells on an integrated circuit die can be organized in planes, blocks, and pages. A plane contains multiple blocks; a block contains multiple pages; and a page can have multiple strings of memory cells. For example, an integrated circuit die can be the smallest unit that can independently execute commands or report status; identical, concurrent operations can be executed in parallel on multiple planes in an integrated circuit die; a block can be the smallest unit to perform an erase operation; and a page can be the smallest unit to perform a data program operation (to write data into memory cells). Each string has its memory cells connected to a common bitline; and the control gates of the memory cells at the same positions in the strings in a block or page are connected to a common wordline. Control signals can be applied to wordlines and bitlines to address the individual memory cells.

The integrated circuit memory device 130 has a communication interface 147 to receive a command having an address 135 from the controller 115 of a memory sub-system 110, retrieve both hard bit data 177 and soft bit data 173 from the memory address 135, and provide at least the hard bit data 177 as a response to the command. An address decoder 141 of the integrated circuit memory device 130 converts the address 135 into control signals to select a group of memory cells in the integrated circuit memory device 130; and a read/write circuit 143 of the integrated circuit memory device 130 performs operations to determine the hard bit data 177 and the soft bit data 173 of memory cells at the address 135.

The integrated circuit memory device 130 has a calibration circuit 145 configured to determine measurements of signal and noise characteristics 139 of memory cells in a group (e.g., 131, . . . , or 133). For example, the statistics of memory cells in a group or region that has a particular state at one or more test voltages can be measured to determine the signal and noise characteristics 139. Optionally, the signal and noise characteristics 139 can be provided by the memory device 130 to the controller 115 of a memory sub-system 110 via the communication interface 147.

In at least some embodiments, the calibration circuit 145 determines the optimized read voltage(s) of the group of memory cells based on the signal and noise characteristics 139. In some embodiments, the signal and noise characteristics 139 are further used in the calibration circuit 145 to determine whether the error rate in the hard bit data 177 is sufficiently high such that it is preferred to decode the hard bit data 177 in combination with the soft bit data 173 using a sophisticated decoder. When the use of the soft bit data 173 is predicted, based on the prediction/classification of the error rate in the hard bit data 177, the read manager 113 can transmit both the soft bit data 173 and the hard bit data 177 to the controller 115 of the memory sub-system 110.

For example, the calibration circuit 145 can measure the signal and noise characteristics 139 by reading different responses from the memory cells in a group (e.g., 131, . . . , 133) by varying operating parameters used to read the memory cells, such as the voltage(s) applied during an operation to read data from memory cells.

For example, the calibration circuit 145 can measure the signal and noise characteristics 139 on the fly when executing a command to read the hard bit data 177 and the soft bit data 173 from the address 135. Since the signal and noise characteristics 139 is measured as part of the operation to read the hard bit data 177 from the address 135, the signal and noise characteristics 139 can be used in the read manager 113 with reduced or no penalty on the latency in the execution of the command to read the hard bit data 177 from the address 135.

The read manager 113 of the memory device 130 is configured to use the signal and noise characteristics 139 to determine the voltages used to read memory cells identified by the address 135 for both hard bit data and soft bit data and to determine whether to transmit the soft bit data to the memory sub-system controller 115.

For example, the read manager 113 can use a predictive model, trained via machine learning, to predict the likelihood of the hard bit data 177 retrieved from a group of memory cells (e.g., 131 or 133) failing a test of data integrity. The prediction can be made based on the signal and noise characteristics 139. Before the test is made using error-correcting code (ECC) and/or low-density parity-check (LDPC) code, or even before the hard bit data 177 is transferred to a decoder, the read manager 113 uses the signal and noise characteristics 139 to predict the result of the test. Based on the predicted result of the test, the read manager 113 determines whether to transmit the soft bit data to the memory sub-system controller 115 in a response to the command.

For example, if the hard bit data 177 is predicted to decode using a low-power decoder that uses hard bit data 177 without using the soft bit data 173, the read manager 113 can skip the transmission of the soft bit data 173 to the memory sub-system controller 115; and the read manager 113 provides the hard bit data 177, read from the memory cells using optimized read voltages calculated from the signal and noise characteristics 139, for decoding by the low-power decoder. For example, the low-power decoder can be implemented in the memory sub-system controller 115. Alternatively, the low-power decoder can be implemented in the memory device 130; and the read manager 113 can provide the result of the lower-power decoder to the memory sub-system controller 115 as the response to the received command.

For example, if the hard bit data 177 is predicted to fail in decoding in the low-power decoder but can be decoded using a high-power decoder that uses both hard bit data and soft bit data, the read manager 113 can decide to provide both the hard bit data 177 and the soft bit data 173 for decoding by the high-power decoder. For example, the high-power decoder can be implemented in the controller 115. Alternatively, the high-power decoder can be implemented in the memory device 130.

Optionally, if the hard bit data 177 is predicted to fail in decoding in decoders available in the memory sub-system 110, the read manager 113 can decide to skip transmitting the hard bit data 177 to the memory sub-system controller 115, initiate a read retry immediately, such that when the memory sub-system controller 115 requests a read retry, at least a portion of the read retry operations is performed to reduce the time for responding to the request from the memory sub-system controller 115 for a read retry. For example, during the read retry, the read manager 113 instructs the calibration circuit 145 to perform a modified calibration to obtain a new set of signal and noise characteristics 139, which can be further used to determine improved read voltages.

The data from the memory cells identified by the address (135) can include hard bit data 177 and soft bit data 173. The hard bit data 177 is retrieved using optimized read voltages. The hard bit data 177 identifies the states of the memory cells that are programmed to store data and subsequently detected in view of changes caused by factors, such as charge loss, read disturb, cross-temperature effect (e.g., write and read at different operating temperatures), etc. The soft bit data 173 is obtained by reading the memory cells using read voltages centered at each optimized read voltage with a predetermined offset from the center, optimized read voltage. The XOR of the read results at the read voltages having the offset indicates whether the memory cells provide different read results at the read voltages having the offset. The soft bit data 173 can include the XOR results. In some instances, one set of XOR results is obtained based on a smaller offset; and another set of XOR results is obtained based on a larger offset. In general, multiple sets of XOR results can be obtained for multiple offsets, where each respective offset is used to determine a lower read voltage and a higher read voltage such that both the lower and higher read voltages have the same respective offset from an optimized read voltage to determine the XOR results.

Figure 3:
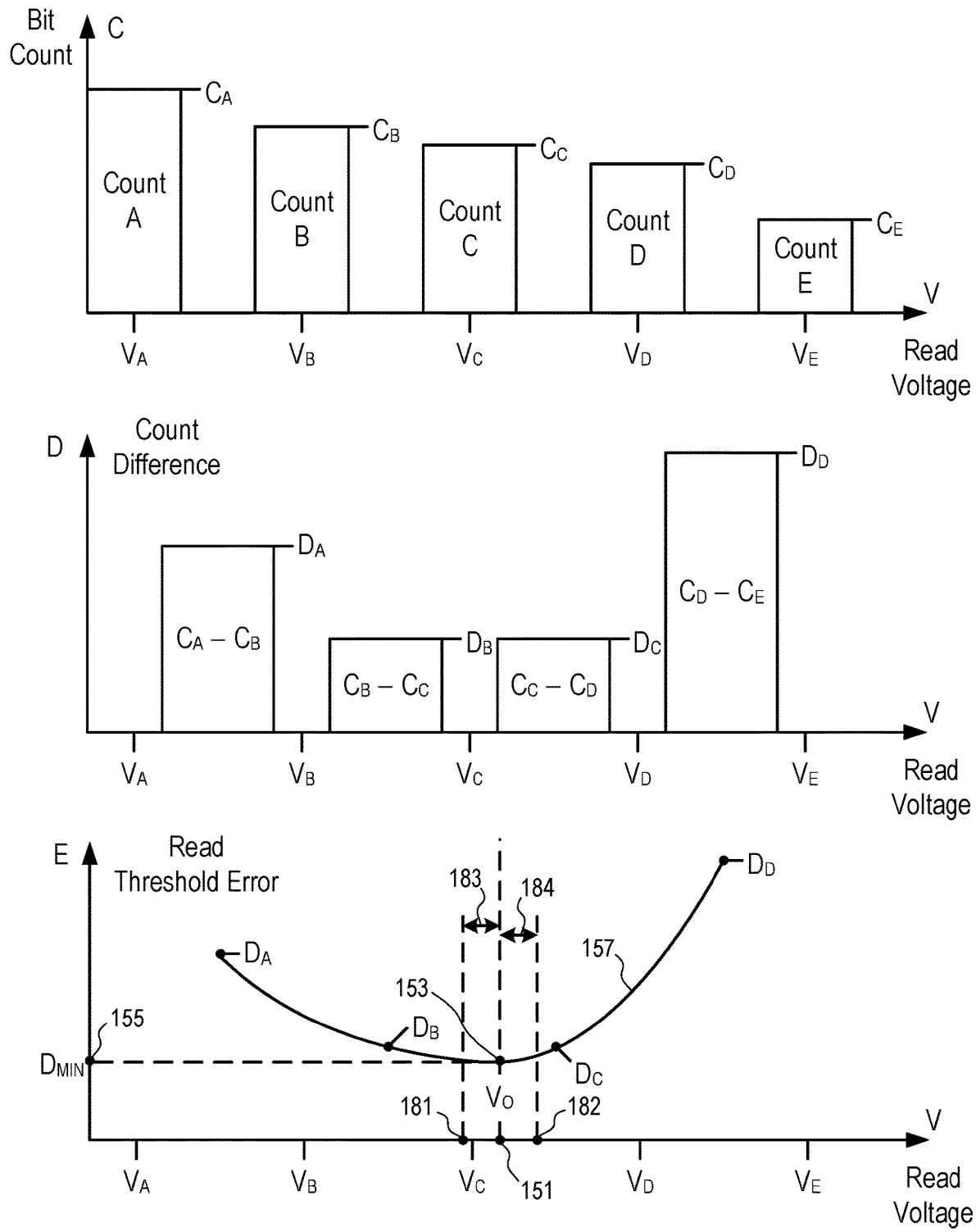
FIG. 3 shows an example of measuring signal and noise characteristics to improve memory operations according to one embodiment.

FIG. 3 shows an example of measuring signal and noise characteristics 139 to improve memory operations according to one embodiment.

In FIG. 3, the calibration circuit 145 applies different read voltages $V_A$, $V_B$, $V_C$, $V_D$, and $V_E$ to read the states of memory cells in a group (e.g., 131, ..., or 133). In general, more or less read voltages can be used to generate the signal and noise characteristics 139.

As a result of the different voltages applied during the read operation, a same memory cell in the group (e.g., 131, ..., or 133) may show different states. Thus, the counts $C_A$, $C_B$, $C_C$, $C_D$, and $C_E$ of memory cells having a predetermined state at different read voltages $V_A$, $V_B$, $V_C$, $V_D$, and $V_E$ can be different in general. The predetermined state can be a state of having substantial current passing through the memory cells, or a state of having no substantial current passing through the memory cells. The counts $C_A$, $C_B$, $C_C$, $C_D$, and $C_E$ can be referred to as bit counts.

The calibration circuit 145 can measure the bit counts by applying the read voltages $V_A$, $V_B$, $V_C$, $V_D$, and $V_E$ one at a time on the group (e.g., 131, ..., or 133) of memory cells.

Alternatively, the group (e.g., 131, ..., or 133) of memory cells can be configured as multiple subgroups; and the calibration circuit 145 can measure the bit counts of the subgroups in parallel by applying the read voltages $V_A$, $V_B$, $V_C$, $V_D$, and $V_E$. The bit counts of the subgroups are considered as representative of the bit counts in the entire group (e.g., 131, ..., or 133). Thus, the time duration of obtaining the counts $C_A$, $C_B$, $C_C$, $C_D$, and $C_E$ can be reduced.

In some embodiments, the bit counts $C_A$, $C_B$, $C_C$, $C_D$, and $C_E$ are measured during the execution of a command to read the data from the address 135 that is mapped to one or more memory cells in the group (e.g., 131, ..., or 133). Thus, the controller 115 does not need to send a separate command to request for the signal and noise characteristics 139 that is based on the bit counts $C_A$, $C_B$, $C_C$, $C_D$, and $C_E$.

The differences between the bit counts of the adjacent voltages are indicative of the errors in reading the states of the memory cells in the group (e.g., 133, ..., or 133).

For example, the count difference $D_A$ is calculated from $C_A$-$C_B$, which is an indication of read threshold error introduced by changing the read voltage from $V_A$ to $V_B$.

Similarly, $D_B$=$C_B$-$C_C$; $D_C$=$C_C$-$C_D$; and $D_D$=$C_D$-$C_E$.

The curve 157, obtained based on the count differences $D_A$, $D_B$, $D_C$, and $D_D$, represents the prediction of read threshold error E as a function of the read voltage. From the curve 157 (and/or the count differences), the optimized read voltage $V_O$ can be calculated as the point 153 that provides the lowest read threshold error $D_{MIN}$ on the curve 157.

In one embodiment, the calibration circuit 145 computes the optimized read voltage $V_O$ and causes the read/write circuit 143 to read the data from the address 135 using the optimized read voltage $V_O$.

Alternatively, the calibration circuit 145 can provide, via the communication interface 147 to the controller 115 of the memory sub-system 110, the count differences $D_A$, $D_B$, $D_C$, and $D_D$ and/or the optimized read voltage $V_O$ calculated by the calibration circuit 145.

FIG. 3 illustrates an example of generating a set of statistical data (e.g., bit counts and/or count differences) for reading at an optimized read voltage $V_O$. In general, a group of memory cells can be configured to store more than one bit in a memory cell; and multiple read voltages are used to read the data stored in the memory cells. A set of statistical data can be similarly measured for each of the read voltages to identify the corresponding optimized read voltage, where the test voltages in each set of statistical data are configured in the vicinity of the expected location of the corresponding optimized read voltage. Thus, the signal and noise characteristics 139 measured for a memory cell group (e.g., 131 or 133) can include multiple sets of statistical data measured for the multiple threshold voltages respectively.

For example, the controller 115 can instruct the memory device 130 to perform a read operation by providing an address 135 and at least one read control parameter. For example, the read control parameter can be a suggested read voltage.

The memory device 130 can perform the read operation by determining the states of memory cells at the address 135 at a read voltage and provide the data according to the determined states.

During the read operation, the calibration circuit 145 of the memory device 130 generates the signal and noise characteristics 139. The data and the signal and noise characteristics 139 are provided from the memory device 130 to the controller 115 as a response. Alternatively, the processing of the signal and noise characteristics 139 can be performed at least in part using logic circuitry configured in the memory device 130. For example, the processing of the signal and noise characteristics 139 can be implemented partially or entirely using the processing logic configured in the memory device 130. For example, the processing logic can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

The signal and noise characteristics 139 can be determined based at least in part on the read control parameter. For example, when the read control parameter is a suggested read voltage for reading the memory cells at the address 135, the calibration circuit 145 can compute the read voltages $V_A$, $V_B$, $V_C$, $V_D$, and $V_E$ that are in the vicinity of the suggested read voltage.

The signal and noise characteristics 139 can include the bit counts $C_A$, $C_B$, $C_C$, $C_D$, and $C_E$. Alternatively, or in combination, the signal and noise characteristics 139 can include the count differences $D_A$, $D_B$, $D_C$, and $D_D$.

Optionally, the calibration circuit 145 uses one method to compute an optimized read voltage $V_O$ from the count differences $D_A$, $D_B$, $D_C$, and $D_D$; and the controller 115 uses another different method to compute the optimized read voltage $V_O$ from the signal and noise characteristics 139 and optionally other data that is not available to the calibration circuit 145.

When the calibration circuit 145 can compute the optimized read voltage $V_O$ from the count differences $D_A$, $D_B$, $D_C$, and $D_D$ generated during the read operation, the signal and noise characteristics can optionally include the optimized read voltage $V_O$. Further, the memory device 130 can use the optimized read voltage $V_O$ in determining the hard bit data in the data from the memory cells at the address 135. The soft bit data in the data can be obtained by reading the memory cells with read voltages that are a predetermined offset away from the optimized read voltage $V_O$. Alternatively, the memory device 130 uses the controller-specified read voltage provided in the read control parameter in reading the data.

The controller 115 can be configured with more processing power than the calibration circuit 145 of the integrated circuit memory device 130. Further, the controller 115 can have other signal and noise characteristics applicable to the memory cells in the group (e.g., 133, . . . , or 133). Thus, in general, the controller 115 can compute a more accurate estimation of the optimized read voltage $V_O$ (e.g., for a subsequent read operation, or for a retry of the read operation).

In general, it is not necessary for the calibration circuit 145 to provide the signal and noise characteristics 139 in the form of a distribution of bit counts over a set of read voltages, or in the form of a distribution of count differences over a set of read voltages. For example, the calibration circuit 145 can provide the optimized read voltage $V_O$ calculated by the calibration circuit 145, as signal and noise characteristics 139.

The calibration circuit 145 can be configured to generate the signal and noise characteristics 139 (e.g., the bit counts, or bit count differences) as a byproduct of a read operation. The generation of the signal and noise characteristics 139 can be implemented in the integrated circuit memory device 130 with little or no impact on the latency of the read operation in comparison with a typical read without the generation of the signal and noise characteristics 139. Thus, the calibration circuit 145 can determine signal and noise characteristics 139 efficiently as a byproduct of performing a read operation according to a command from the controller 115 of the memory sub-system 110.

In general, the calculation of the optimized read voltage $V_O$ can be performed within the memory device 130, or by a controller 115 of the memory sub-system 110 that receives the signal and noise characteristics 139 as part of enriched status response from the memory device 130.

The hard bit data 177 can be obtained by applying the optimized read voltage $V_O$ on the group of memory cells and determining the state of the memory cells while the memory cells are subjected to the optimized read voltages $V_O$.

The soft bit data 173 can be obtained by applying the read voltages 181 and 182 that are offset from the optimized read voltage $V_O$ with a predetermined amount. For example, the read voltage 181 is at the offset 183 of the predetermined amount lower from the optimized read voltage $V_O$; and the read voltage 182 is at the offset 184 of the same predetermined amount higher from the optimized read voltage $V_O$. A memory cell subjected to the read voltage 181 can have a state that is different from the memory cell subjected to the read voltage 182. The soft bit data 173 can include or indicate the XOR result of the data read from the memory cell using the read voltages 181 and 182. The XOR result shows whether the memory cell subjected to the read voltage 181 has the same state as being to the read voltage 182.

Figure 4:
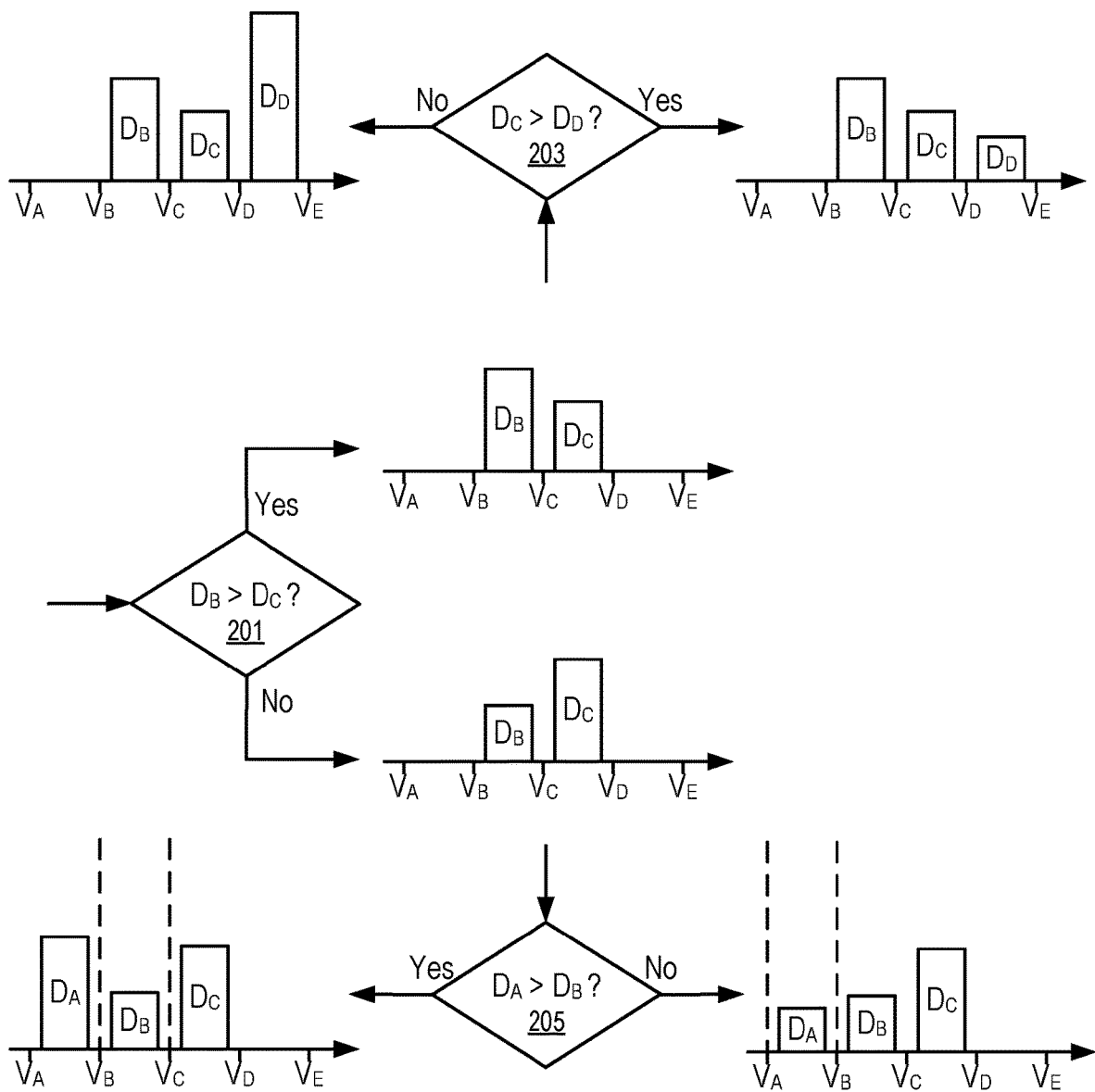
FIGS. 4-6 illustrate a technique to compute an optimized read voltage from count differences according to one embodiment.
Figure 5:
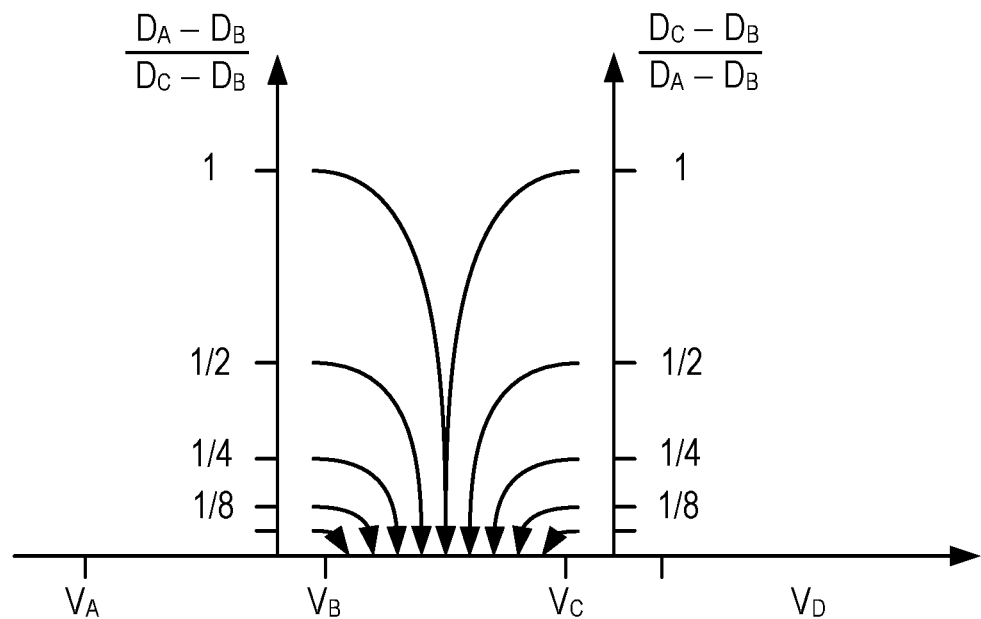
Figure 6:
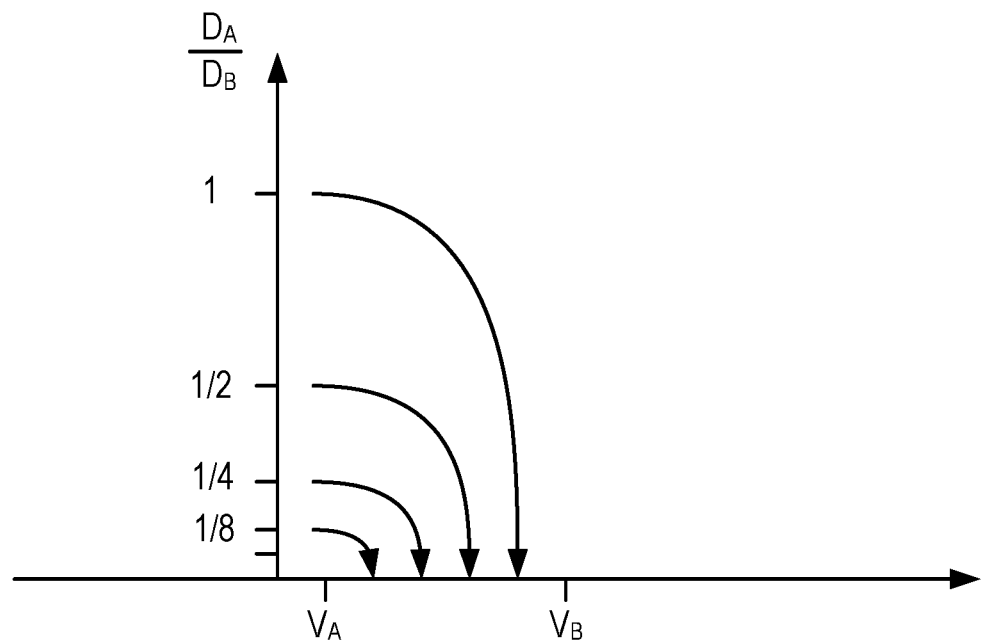

FIGS. 4-6 illustrate a technique to compute an optimized read voltage from count differences according to one embodiment. The technique of FIGS. 4-6 simplifies the computation for calculating the optimized read voltage $V_O$ such that the computation can be implemented using reduced computing power and/or circuitry.

The computation illustrated in FIGS. 4-6 can be performed based on the bit counts and count differences illustrated in FIG. 3 for test voltages $V_A$, $V_B$, $V_C$, $V_D$, and $V_E$.

In FIG. 4, an operation 201 is performed to compare the two center count differences $D_B$ and $D_C$.

If $D_B$ is greater than $D_C$, it can be assumed that a minimal can be found on the higher half of the test voltage region between $V_C$ to $V_E$. Thus, operation 203 is performed to compare the lower one $D_C$ of the two center bit count differences with its other neighbor $D_D$.

If $D_C$ is no greater than its other neighbor $D_D$, $D_C$ is no greater than its neighbors $D_B$ and $D_D$. Thus, it can be inferred that a minimal can be found between the test voltages $V_C$ and $V_D$. Based on a ratio between the differences of $D_C$ from its neighbors $D_B$ and $D_D$, an estimate of the location of the optimized read voltage $V_O$ can be determined using a technique similar to that illustrated in FIG. 5.

If $D_C$ is greater than its other neighbor $D_D$, it can be assumed that a minimal can be in the highest test voltage interval between $V_D$ and $V_E$. Thus, an estimate of the location of the optimized read voltage $V_O$ can be determined using a technique similar to that illustrated in FIG. 6, based on a ratio of count differences $D_D$ and $D_C$ that are closest to the test voltages $V_D$ and $V_E$.

Similarly, if $D_B$ is no greater than $D_C$, it can be assumed that a minimal can be found on the lower half of the test voltage region between $V_A$ to $V_C$. Thus, operation 205 is performed to compare the lower one $D_B$ of the two center bit count differences with its other neighbor $D_A$.

If $D_B$ is less than its other neighbor $D_A$, $D_B$ is no greater than its neighbors $D_A$ and $D_C$. Thus, it can be inferred that a minimal can be found between the test voltages $V_B$ and $V_C$. Based on a ratio between the differences of $D_B$ from its neighbors $D_A$ and $D_C$, an estimate of the location of the optimized read voltage $V_O$ can be determined using a technique illustrated in FIG. 5.

If $D_B$ is no less than its other neighbor $D_A$, it can be assumed that a minimal can be in the lowest test voltage interval between $V_A$ and $V_B$. Thus, an estimate of the location of the optimized read voltage $V_O$ can be determined using a technique illustrated in FIG. 6, based on a ratio of the count differences $D_A$ and $D_B$ that are closest to the test voltages $V_A$ and $V_B$.

FIG. 5 illustrates a technique to estimate the location of the optimized read voltage $V_O$ when a center count difference $D_B$ is no greater than its neighbors $D_A$ and $D_C$.

Since the count difference $D_B$ is the difference of bit counts $C_B$ and $C_C$ at test voltages $V_B$ and $V_C$, the location of the optimized read voltage $V_O$ is estimated to be within the voltage interval or gap between $V_B$ and $V_C$.

When the increases from the center count difference $D_B$ to its neighbors $D_A$ and $D_C$ are substantially equal to each other, the optimized read voltage $V_O$ is estimated at the midpoint between $V_B$ and $V_C$.

The ratio between the increases from the center count difference $D_B$ to its neighbors $D_A$ and $D_C$ can be mapped in a logarithmic scale to a line scale of division between the test voltages $V_B$ and $V_C$.

For example, the ratio $(D_A-D_B)/(D_C-D_B)$ of 1 is mapped to a location of the optimized read voltage at the midpoint between the test voltages $V_B$ and $V_C$.

The ratio $(D_A-D_B)/(D_C-D_B)$ of ½ is mapped to a location of the optimized read voltage at the midpoint between the test voltages $V_B$ and $V_C$ with an offset of a fixed increment towards $V_B$. For example, the increment can be one tenth of the voltage gap between $V_B$ and $V_C$.

Similarly, the ratio $(D_A-D_B)/(D_C-D_B)$ of ¼, ⅛, or 1/16 is mapped to a location of the optimized read voltage at the midpoint between the test voltages $V_B$ and $V_C$ with an offset of two, three, or four increments towards $V_B$. A ratio $(D_A-D_B)/(D_C-D_B)$ smaller than 1/16 can be mapped to a location of the optimized read voltage at $V_B$.

Similarly, the ratio $(D_C-D_B)/(D_A-D_B)$ of ½, ¼, ⅛, or 1/16 is mapped to a location of the optimized read voltage at the midpoint between the test voltages $V_B$ and $V_C$ with an offset of one, two, three, or four increments towards $V_C$. A ratio $(D_C-D_B)/(D_A-D_B)$ smaller than 1/16 can be mapped to a location of the optimized read voltage at $V_C$.

The technique of FIG. 5 can be implemented via setting a coarse estimation of the optimized read voltage at $V_B$ (or $V_C$) and adjusting the coarse estimation through applying the increment according to comparison of the increase $(D_A-D_B)$ of the count difference $D_B$ to the count difference $D_A$ with fractions or multiples of the increase $(D_C-D_B)$ of the count difference $D_B$ to the count difference $D_C$. The fractions or multiples of the increase $(D_C-D_B)$ in a logarithmic scale can be computed through iterative division or multiplication by two, which can be implemented efficiently through bit-wise left shift or right shift operations.

For example, the initial estimate of the optimized voltage $V_O$ can be set at the test voltage $V_B$. The increase $(D_A-D_B)$ can be compared with $(D_C-D_B)/16$, which can be computed through shifting the bits of $(D_C-D_B)$. If $(D_A-D_B)$ is greater than $(D_C-D_B)/16$, the increment of one tenth of the gap between $V_B$ and $V_C$ can be added to the estimate of the optimized voltage $V_O$. Subsequently, $(D_A-D_B)$ is compared to $(D_C-D_B)/8$, which can be calculated by shifting the bits of $(D_C-D_B)/16$. If $(D_A-D_B)$ is greater than $(D_C-D_B)/8$, the same increment of one tenth of the gap between $V_B$ and $V_C$ is further added to the estimation of the optimized voltage $V_O$. Similarly, $(D_A-D_B)$ is compared to $(D_C-D_B)/4$, $(D_C-D_B)/2$, $(D_C-D_B)$, $(D_C-D_B)*2$, $(D_C-D_B)*4$, $(D_C-D_B)*8$, and $(D_C-D_B)*16$ one after another. If $(D_A-D_B)$ is greater than any of these scaled versions of $(D_C-D_B)$ in a comparison, the same increment is added to the estimate. After the series of comparisons, the resulting estimate can be used as the optimized voltage $V_O$.

FIG. 6 illustrates a technique to estimate the location of the optimized read voltage $V_O$ when a side count difference $D_A$ is smaller than its next two count differences $D_B$ and $D_C$, but one of its neighbors has not been measured (e.g., a count difference between the test voltage $V_A$ and a further test voltage that is lower than $V_A$).

Since the count difference $D_A$ is the lowest among count differences $D_A$, $D_B$ and $D_C$, the optimized voltage $V_O$ is estimated to be in the test voltage interval gap corresponding to the count difference $D_A$. Since the count difference $D_A$ is the difference of bit counts $C_A$ and $C_B$ at test voltages $V_A$ and $V_B$, the location of the optimized read voltage $V_O$ is estimated to be within the voltage interval or gap between $V_A$ and $V_B$.

In FIG. 6, the location of the optimized read voltage $V_O$ within the voltage interval or gap between $V_A$ and $V_B$ is based on a ratio of the count differences $D_A$ and $D_B$. The ratio $D_A/D_B$ in a logarithmic scale is mapped to the linear distribution of the optimized read voltage $V_O$ between $V_A$ and $V_B$.

For example, the voltage interval or gap between $V_A$ and $V_B$ can be divided into five equal increments. The initial estimate of the optimized voltage $V_O$ can be set at the test voltage $V_B$. The count difference $D_A$ can be compared to scaled versions of the count difference $D_B$ sequentially, such as $D_B$, $D_B/2$, and $D_B/4$. If the count difference $D_A$ is smaller than any of the scaled versions of the count difference $D_B$ in a comparison, the estimate is reduced by the increment for moving towards the test voltage $V_A$.

FIGS. 4-6 illustrate examples of techniques that can be used to calculate the optimized read voltage $V_O$ when the optimized read voltage $V_O$ is seen to be within the test voltage range $V_A$ to $V_E$. After the optimized read voltage $V_O$ is calculated, the voltage window (e.g., between voltage 181 and 182 illustrated in FIG. 3) for reading soft bit data 173 can be calculated based on a predetermined size for the offsets (e.g., 183 and 184) from the optimized read voltage $V_O$.

However, in some instances, soft bit data 173 read using an alternative voltage window can provide improved results in decoding the hard bit data 177. For example, in some instances, a voltage window having a size that is larger (or smaller) than the standard gap (e.g., 100 mV) pre-defined by the predetermined offsets (e.g., 183 and 183) can be optimal, or better than the standard gap, in generating soft bit data 173 for the decoding of the hard bit data 177. In other instances, a voltage window not centered at the calculated/optimized/calibrated read voltage $V_O$, and thus asymmetric about the calculated/optimized/calibrated read voltage $V_O$, can be optimal, or better than the symmetric voltage window, in generating soft bit data 173 for the decoding of the hard bit data 177, as further discussed below.

Figure 7:
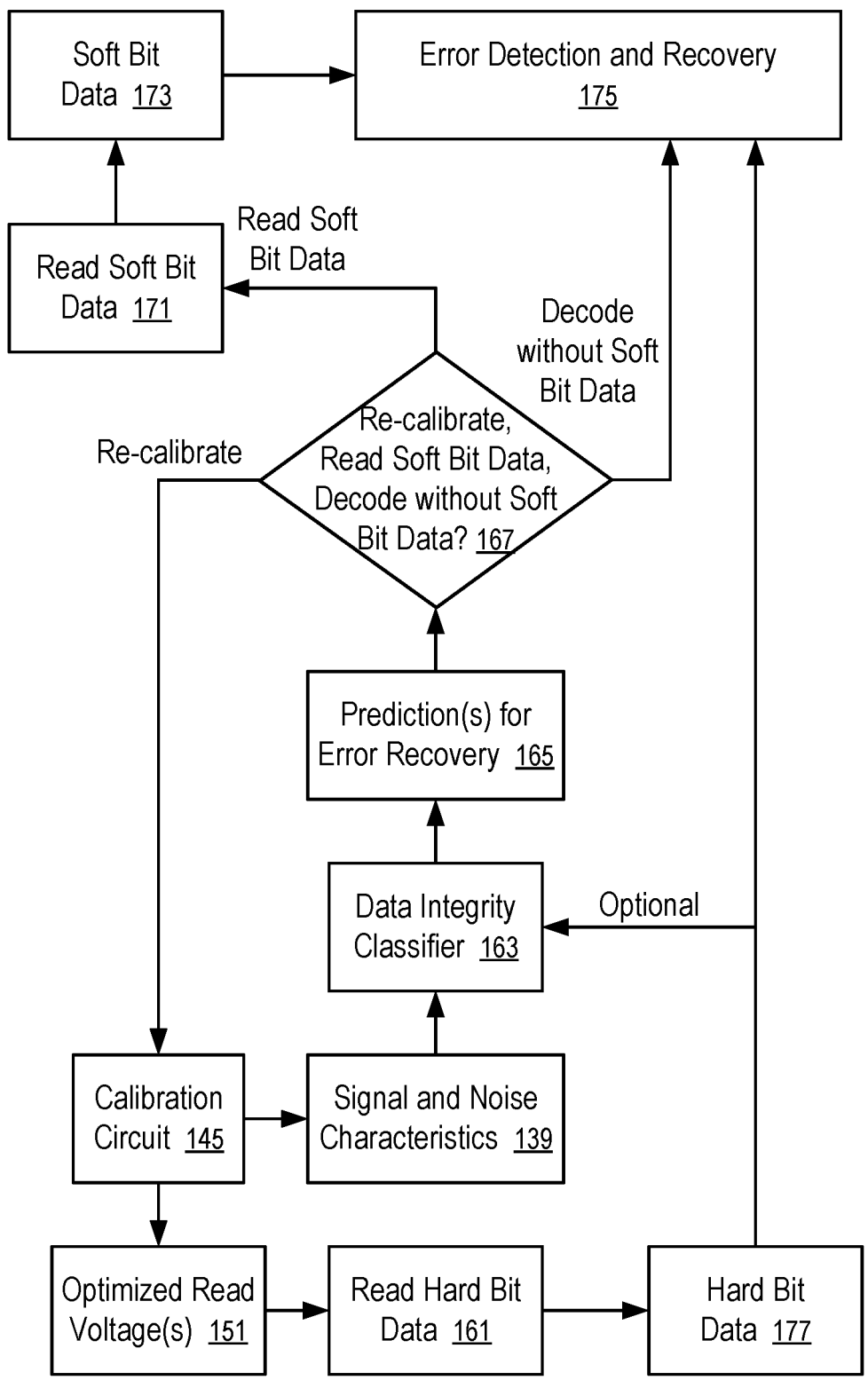
FIG. 7 illustrates iterative operations to retrieve data from memory cells during the execution of a read command according to one embodiment.

FIG. 7 illustrates iterative operations to retrieve data from memory cells during the execution of a read command according to one embodiment. For example, the adaptive and/or iterative operations of a read manager 113 according to FIG. 7 can be implemented in the controller 115 of the memory sub-system 110 of FIG. 1, and/or in an integrated circuit memory device 130 of FIG. 2, using the signal and noise characteristics 139 measured according to FIG. 3.

The sub-operations of FIG. 7 are performed in response to a read command. To execute the read command, the calibration circuit 145 of the memory device 130 measures the signal and noise characteristics 139 using voltages in the vicinity of the suspected location(s) of optimized read voltage(s). For example, the signal and noise characteristics 139 can include bit counts and/or bit differences at read voltages near expected value of the optimize read voltage illustrated in FIG. 3.

The calibration circuit 145 can determine an optimized read voltage(s) 151 from the measured signal and noise characteristics 139 (e.g., in a way as illustrated in FIG. 3). The read/write circuit 143 of the memory device 130 can use the optimized read voltage(s) to read the hard bit data 177. For example, the read/write circuit 143 applies the optimized read voltage(s) the memory cells at the address identified by the read command, and determine the states of the memory cells and thus the corresponding hard bit data 177.

In general, the data retrieved from the memory cells using the optimized read voltages 151 includes at least the hard bit data 177 and can have errors. The data can optionally further include soft bit data 173 read at a predetermined offset(s) from the optimized read voltage(s) 151.

A data integrity classifier 163 determines a prediction(s) 165 for the results of error recovery for the data retrieved from the memory cells according to the optimized read voltages 151.

For example, the data retrieved from the memory cells of the memory device is in an encoded format that allows error detection and recovery 175 (e.g., using techniques such as Error Correction Code (ECC), Low-Density Parity-Check (LDPC) code). The signal and noise characteristics 139 can be provided as input to the data integrity classifier 163 to evaluate the likelihood of the data having too many errors for success decoding the data by some or all the processing paths/modules/options in error detection and recovery 175.

For example, the memory sub-system 110 can include a low power ECC, a full power ECC, an LDPC decoder that does not use soft bit data, and/or an LDPC decoder that uses both hard bit data and soft bit data in decoding. In general, available paths/modules/options for decoding the data in a memory sub-system 110 are not limited to such the examples; different processing paths/modules/options can be implemented; and the different processing paths/modules/options have different power consumption levels, different capabilities in recovering error-free original/non-encoded data from the retrieve raw data, and/or different processing latency.

The data integrity classifier 163 can be trained (e.g., through machine learning) to predict the likelihood of data integrity failure of the data based on the associated signal and noise characteristics 139.

For example, the likelihood of data integrity failure of the data can be in the form of an estimated bit error rate in the data.

For example, the likelihood of data integrity failure of the data can be in the form of a prediction of whether the data can be successfully decoded (e.g., via ECC or LDPC) by any of the processing paths/modules/options for error detection and recovery 175 and if so, which of the processing paths/modules/options is or are predicted to be able to successfully decode the hard bit data 177 having the associated signal and noise characteristics 139.

For example, some of the processing paths/modules/options are implemented in the memory device 130; and some of the processing paths/modules/options are implemented in the controller 115.

Based on the predicted likelihood of data integrity failure of the hard bit data 177, the read manager 113 can select one of the processing paths/modules/options with reduced power consumption, reduced processing latency, and/or a high probability of success in decoding.

In some embodiments, the data integrity classifier 163 is trained to directly provide a prediction of an optimized processing path/module to process the encoded hard bit data 177 retrieved from the memory cells of the memory device 130.

In some embodiments, the data integrity classifier 163 is trained to provide a prediction of a prioritized list of processing paths/modules/options that can successfully decode the encoded hard bit data 177. Further, the data integrity classifier 163 can further provide an indication of the confidence levels of the selected listed processing paths/modules/options in successfully decoding the hard bit data 177.

Optionally, the data integrity classifier 163 can also be trained to evaluate the confidence levels of the prediction(s) 165; and the confidence levels can be used in the selection of an option from the available paths/modules/options in error detection and recovery 175.

Based on the prediction(s) 165, the read manager 113 determines 167 whether to re-calibrate the read thresholds, or to read soft bit data 173, or to decode hard bit data 177 without soft bit data 173. When the read manager 113 determines 167 that the data retrieved or retrievable according to the optimized read voltage 151 is going to fail in all decoders in error recovery 175 implemented in the memory sub-system 110, the read manager 113 instructs the calibration circuit 145 to perform a further calibration (e.g., based on a modified identification of a neighborhood to search for the optimized voltage(s) 151). The iterative calibrations can be performed up to a predetermined threshold of iterations, or until at least one decoder in the memory sub-system 110 is predicted to be able to decode the data retrieved/retrievable based on the calibrated/optimized read voltages. In general, such data for the decoders implemented in the can include hard bit data 177 read using the optimized read voltages, and optionally soft bit data 173 read using read voltages at a predetermined offset(s) away from the optimized read voltages.

After the predetermined threshold of iterations, if the predictions 165 indicate that the data retrieved or retrievable from the memory cells will fail to decode, the memory device 130 can report a failure for the read command or stop the iteration to report the data read from the memory cells using the optimized read voltages.

Optionally, the read manager 113 executes the read of the hard bit data 177 only after the predictions 165 indicate that the data can decode using at least one decoder implemented in the memory sub-system 110.

When the predictions 165 indicate that data can decode using at least one decoder implemented in the memory sub-system 110, the read manager 113 further determines whether soft bit data 173 is needed for a selected processing paths/modules/options of error detection and recovery 175; and if so, the read manager 113 executes the read of the soft bit data 173 by reading the memory cells using read voltages that are at the predetermined offset(s) away from the optimized read voltage(s) 151.

In general, the read manager 113 can be implemented in the memory device 130 and/or in the controller 115 of the memory sub-system 110. For example, one read manager 113 can be implemented in the memory device 130 and customized for scheduling sub-operations in the memory device 130 during the execution of a read command; and another read manager 113 can be implemented in the controller 115 and customized for scheduling sub-operations for the execution of the read command through communications between the memory device 130 and the controller 115. The read manager 113 implemented in the memory device 130 can schedule sub-operations for the read command without communicating with the controller 115. Optionally, no read manager is implemented in the controller 115.

The read manager 113 implemented in the controller 115 can use not only the signal and noise characteristics 139 received from the memory device 130 for the data but also other information that may not be available in the memory device 130, such as charge loss, read disturb, cross-temperature effect, program/erase, data retention, etc. The read manager 113 implemented in the controller 115 and the read manager 113 implemented in the memory device 130 can have different complexity, and/or different levels of accuracy in their predictions. The read manager 113 implemented in the controller 115 and the read manager 113 implemented in the memory device 130 can communicate with each other to collaboratively schedule sub-operations for the execution of the read command.

Optionally, the memory device 130 provides its prediction to the controller 115; and the controller 115 uses the prediction generated by the memory device 130 and/or other information to select a path/module/option for decoding the hard bit data 177. Alternatively, the controller 115 can be independent from the memory device 130 in selecting a path/module/option for decoding the hard bit data 177.

Some of the paths/modules/options of the error detection and recovery 175 can be implemented in the memory device 130. When a path/module/option implemented in the memory device 130 is selected/scheduled for the execution of the read command, the execution of the path/module/option can be scheduled as part of the atomic operation of executing the read command in the memory device 130.

The processing logic of at least a portion of the error detection and recovery 175 and the read manager 113 can be implemented using Complementary metal-oxide-semiconductor (CMOS) circuitry formed under the array of memory cells on an integrated circuit die of the memory device 130. For example, the processing logic can be formed, within the integrated circuit package of the memory device 130, on a separate integrated circuit die that is connected to the integrated circuit die having the memory cells using Through-Silicon Vias (TSVs) and/or other connection techniques.

A read manager 113 can include a data integrity classifier 163. When the data integrity classifier 163 is implemented in the memory device 130, the output of the data integrity classifier 163 can be used in controlling the retrieval of the data (e.g., the hard bit data 177 and/or the soft bit data 173).

For example, when the output of the data integrity classifier 163 indicates that the encoded hard bit data 177 is likely to be decoded using a decoder (e.g., 175) that uses soft bit data, the read manager 113 of the memory device 130 can automatically further read the soft bit data 173 in addition to reading the hard bit data 177. However, if the data integrity classifier indicates that the hard bit data 177 can be decoded using a decoder (e.g., 175) that does not require soft bit data 173 as input, the read manager 113 of the memory device 130 can skip the sub-operations to read soft bit data 173 and/or the operations to transmit the soft bit data to the controller 115.

For example, when the output of the data integrity classifier 163 indicates that none of the available paths/modules/options in the memory sub-system 110 is likely to be successful in decoding the data (e.g., including the hard bit data 177 and the soft bit data 173), the read manager 113 of the memory device 130 can automatically schedule a sub-option of read-retry to search for an improved read voltage(s) as part of the atomic operation of executing the read command in the memory device 130. Further, the read manager 113 of the memory device 130 can optionally skip reading the hard bit data 177 when the output of the data integrity classifier 163 indicates that none of the available paths/modules/options in the error detection and recovery 175 is likely to be successful in decoding the hard bit data 177.

Figure 8:
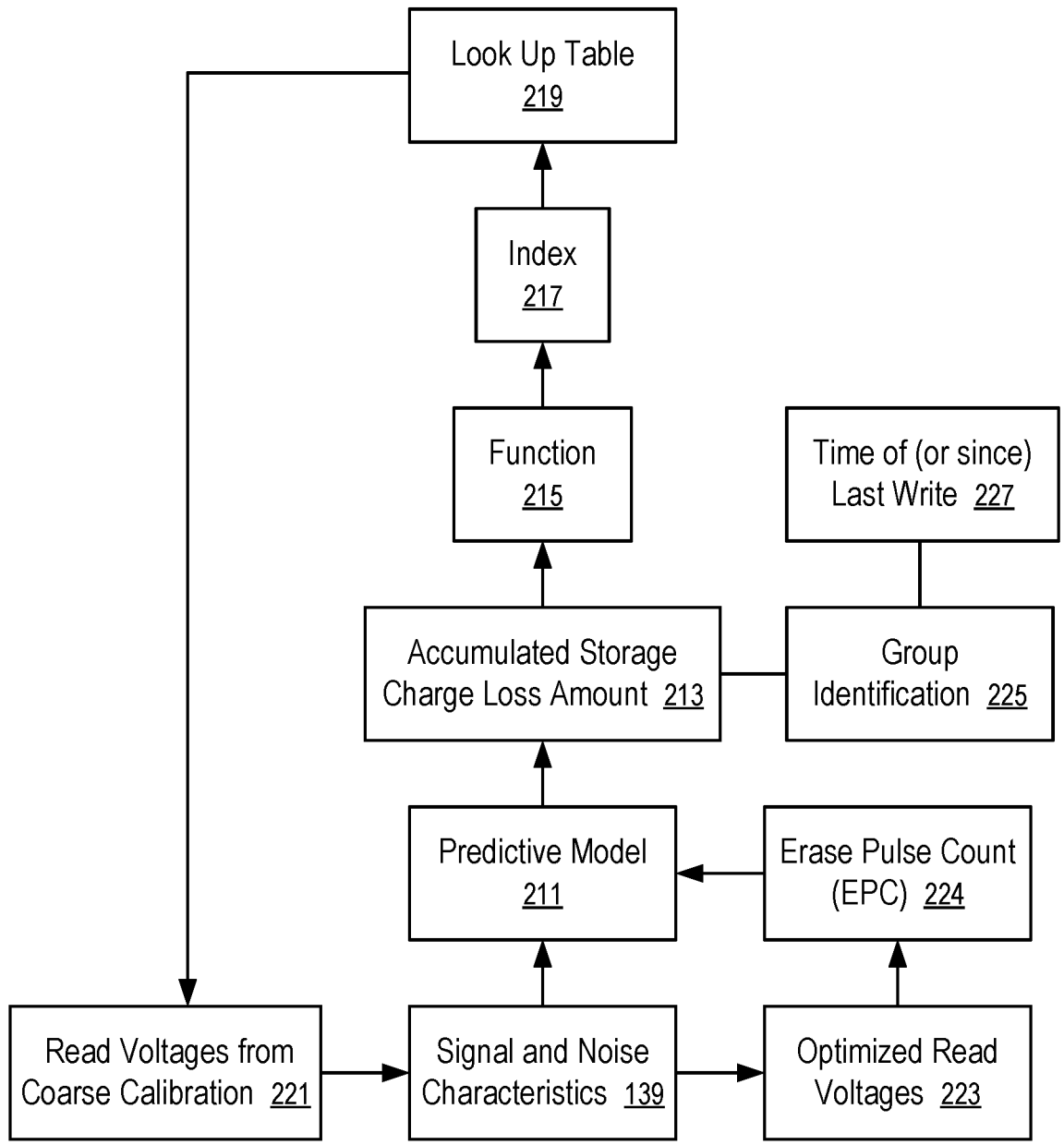
FIG. 8 shows a technique to perform coarse calibrations using signal and noise characteristics of memory cells collected in prior calibrations according to one embodiment.

FIG. 8 shows a technique to perform coarse calibrations using signal and noise characteristics of memory cells collected in prior calibrations according to one embodiment.

When a group of memory cells are configured to each store multiple bits of data, the group of memory cells can be read at a plurality of voltage levels to determine the states of the group of memory cells at the different levels and thus the bits of data stored in each memory cell. An optimized read voltage at each level can be used to determine the state of a memory cell at the level to best determine the bits of data stored in the memory cell.

In FIG. 8, read voltages 221 from a coarse calibration are used as the initial estimates of the optimized read voltages 223 at the different levels. Each of the optimized read voltages can be calibrated via measuring signal and noise characteristics 139 in a test voltage range $V_A$ to $V_E$ centered at a corresponding read voltage 221 from the coarse calibration.

The signal and noise characteristics 139 measured for the determination of an optimized read voltage 223 at a level can include count differences $D_A$ to $D_D$ on a test voltage range $V_A$ to $V_E$, as illustrated in FIG. 3. The read voltage 221 at the level from the coarse calibration can be used as test voltage $V_C$. An optimized read voltage $V_O$ can be determined from the count differences $D_A$ to Do using the techniques illustrated in FIGS. 3-6. Thus, optimized read voltages 223 can be determined for the different read levels from the read voltages 221 from the coarse calibration and the signal and noise characteristics 139 measured in test voltage ranges configured according to the read voltages 221 from the coarse calibration.

The signal and noise characteristics 139 can further include erased page check (EPC) 224. When the memory device 130 reads the group of memory cells at an optimized read voltage 223 (e.g., $V_O$) at a level, the memory device 130 can count the memory cells in the group that have threshold voltages higher than the optimized read voltage 223 (e.g., $V_O$). Such memory cells remain non-conductive at the optimized read voltage 223 (e.g., $V_O$).

The signal and noise characteristics 139 is provided as an input to a predictive model 211 trained/configured to compute the amount of accumulated storage charge loss (SCL) 213 in the group of memory cells. In some implementations, the count differences $D_A$ to $D_D$ and the erased page check (EPC) 224 measured in the test voltage range $V_A$ to $V_E$ for the calibration of the read voltage $V_O$ at the highest level are used in the predictive model 211. In other implementations, signal and noise characteristics 139 measured for other levels of read voltages are also used in the predictive model 211.

The computed amount of accumulated storage charge loss (SCL) 213 can be stored in association with the identification 225 of the group of memory cells (e.g., 131 or 133). When a coarse calibration of the group of memory cells is needed, the amount of accumulated storage charge loss 213 is used as an input to a function 215 that identifies an index 217. The index 217 can be used in a look up table 219 to retrieve read voltages 221 in a coarse calibration.

For example, the index can optionally correspond to a range of dynamic voltage for controlling the gate of memory cells during read (e.g. dynamic VpassR) that is traditionally used to select a set of coarsely calibrated read voltages from the look up table 219. Thus, optionally, dynamic VpassR sensed during a read operation can also be used to obtain the index for the coarse calibration using the look up table 219 (e.g., in situations where the dynamic VpassR can accurately represent the highest threshold voltage in the group of memory cells).

For example, when the read manager 113 determines 167 in FIG. 7 to re-calibrate (e.g., when an optimized read voltage obtained in the current iteration are determined to be in a wrong voltage region globally), the amount of accumulated storage charge loss (SCL) 213 can be used to obtain the read voltages as the initial estimates of the optimized read voltages 223 in the next iteration of calibration illustrated in FIG. 7.

Alternatively, or in combination, the amount of accumulated storage charge loss (SCL) 213 can be stored in association with the time 227 of last write performed on the group of memory cells. Thus, when a group of memory cells (e.g., 131 or 133) having a similar time of last write (e.g., when a gap to the time 227 of last write is less than a threshold) and a similar temperature history, the accumulated storage charge loss (SCL) 213 can be used to perform the coarse calibration and look up the read voltages 221 from the look up table 219. In other implementations, the accumulated storage charge loss (SCL) can be estimated based on how much a read threshold has shift. Such a shift can be due to time and temperature. Estimating accumulated storage charge loss (SCL) 213 based on the count differences $D_A$ to $D_D$ and the erase pulse count (EPC) 224 can be a faster solution in at least some situations.

Alternatively, or in combination, the accumulated storage charge loss (SCL) 213 can be stored in association with the time 227 since last write performed on the group of memory cells. Thus, when a group of memory cells (e.g., 131 or 133) having a similar time since last write (e.g., when a difference from the time 227 is less than a threshold), the amount of accumulated storage charge loss (SCL) 213 can be used to perform the coarse calibration and look up the read voltages 221 from the look up table 219.

Optionally, a set of data points associating amount of accumulated storage charge loss (SCL) 213 and time 227 since last write can be used to estimate the amount of accumulated storage charge loss (SCL) for a given time since last write. For example, an interpolation technique or a curve fitting technique can be used to predict an amount of accumulated storage charge loss 213 resulting from a given time since last write.

Figure 9:
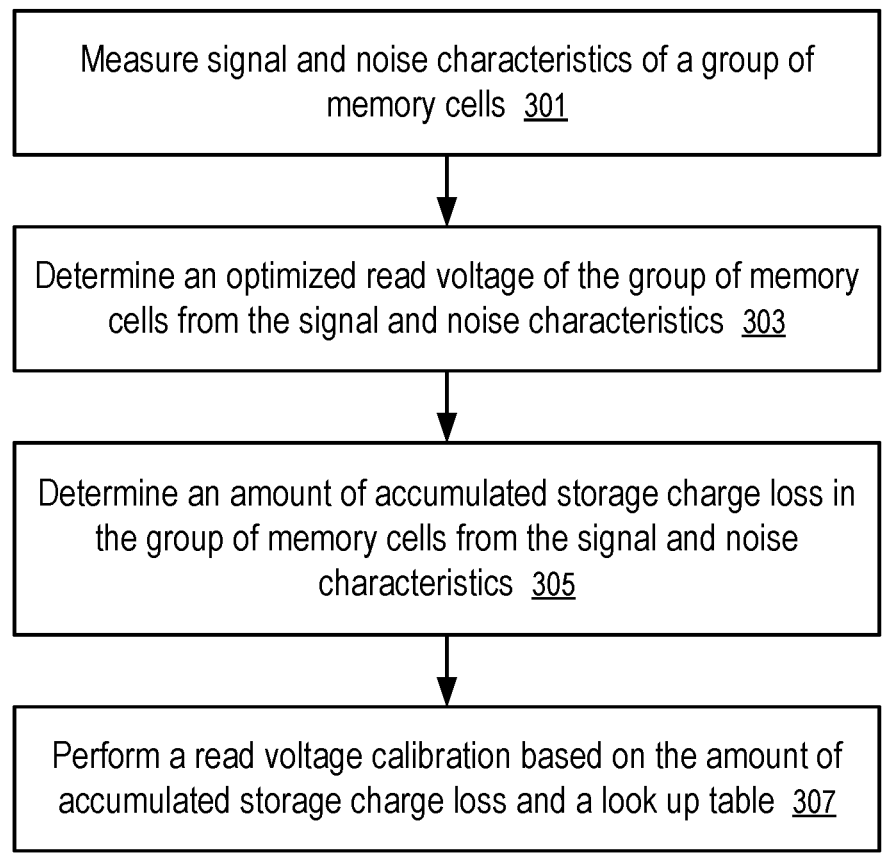
FIG. 9 shows a method to perform read voltage calibration according to one embodiment.

FIG. 9 shows a method to perform read voltage calibration according to one embodiment. The method of FIG. 9 can be performed by processing logic that can include hardware (e.g., processing device, circuitry, dedicated logic, programmable logic, microcode, hardware of a device, integrated circuit, etc.), software/firmware (e.g., instructions run or executed on a processing device), or a combination thereof. In some embodiments, the method of FIG. 9 is performed at least in part by the controller 115 of FIG. 1, or processing logic in the memory device 130 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

For example, the method of FIG. 9 can be implemented in a computing system of FIG. 1 with a memory device of FIG. 2 and signal noise characteristics illustrated in FIG. 3 with some of the operations illustrated in FIGS. 4-8.

At block 301, a memory device 130 measures signal and noise characteristics 139 of a group of memory cells (e.g., 131 or 133).

For example, the memory device 130 can ramp up the read voltage applied on the group of memory cells to $V_C$ to count the number of memory cells that output one (or zero) as the bit count $C_C$ at $V_C$. Then, the memory device 130 can boost modulate the read voltages of four sub-groups in the group to $V_A$, $V_B$, $V_D$ and $V_E$ respectively in parallel to count the number of memory cells that output one (or zero) at $V_A$, $V_B$, $V_D$ and $V_E$ respective. The counts of the sub-groups can be scaled according to the population ratio(s) between sub-groups and the entire group to determine the bit counts $C_A$, $C_B$, $C_D$ and $C_E$ respectively.

Alternatively, the memory device 130 can read the group of memory cells at $V_A$ to $V_E$ sequentially to determine the bit counts $C_A$ to $C_E$.

At block 303, the memory device 130 determines an optimized read voltage $V_O$ of the group of memory cells (e.g., 131 or 133) from the signal and noise characteristics 139.

For example, the signal and noise characteristics 139 can include count differences $D_A$ to $D_D$; and the optimized read voltage $V_O$ can be determined using the techniques illustrated in FIGS. 3-7.

Further, the signal and noise characteristics 139 can include a count of memory cells, within the group of memory cells (e.g., 131 or 133), that have threshold voltages higher than the optimized read voltage $V_O$.

At block 305, the memory device 130 determines an amount of accumulated storage charge loss 213 in the group of memory cells (e.g., 131 or 133) from the signal and noise characteristics 139.

For example, the count differences $D_A$ to Do and the count of memory cells (e.g., erased page check (EPC) 224), within the group of memory cells (e.g., 131 or 133), that have threshold voltages higher than the optimized read voltage $V_O$ can be used in a predictive model 211 to compute the amount of accumulated storage charge loss 213.

For example, the predictive model 211 can be trained through machine learning to calculate the amount of accumulated storage charge loss 213. Alternatively, the predictive model 211 can be established through a statistical analysis, curve fitting, tree-based classification, etc.

The group of memory cells (e.g., 131 or 133) can be configured to store multiple bits per memory cell and has a plurality of voltage levels for reading. The signal and noise characteristics 139 used in the predictive model 211 can include the count differences $D_A$ to Do for the calculation of the optimized read voltage $V_O$ at the highest level among the plurality voltage levels and the corresponding count of memory cells that have threshold voltages higher than the optimized read voltage $V_O$ at the highest level. Optionally, count differences and EPCs associated with one or more optimized read voltages at other levels can also be used in the predictive model 211 as input to determine the amount of accumulated storage charge loss 213.

At block 307, the memory device 130 performs a read voltage calibration based on the amount of accumulated storage charge loss 213 and a look up table 219.

For example, the memory device 130 uses the amount of accumulated storage charge loss 213 to determine an index 217 that corresponds to a range of highest threshold voltage (e.g., that may be measured as dynamic VpassR in some situations). The index can be used in the look up table 219 to retrieve estimates of optimized read voltages corresponding to the index.

For example, the estimates can be used as read voltages 221 from a coarse calibration to identify test voltage ranges where signal and noise characteristics 139 can be measured to calculate optimized read voltages 223.

For example, in response to a decision 167 to re-calibrate the optimized voltages of the group of memory cells (e.g., 131 or 133) in an iterative calibration operation, the read voltages 221 retrieved from the look up table 219 can be used to set the centers (e.g., $V_C$) of the test voltage ranges (e.g., $V_A$ to $V_E$) to measure signal and noise characteristics 139.

For example, when one or more optimized read voltages are found to be calibrated into incorrect regions globally, the read voltages 221 from the look up table 219 can be used to identify the correct regions in searching for the optimized read voltages.

The memory device 130 can store the amount of accumulated storage charge loss 213 in association with an identification of the group of the memory cells (e.g., 131 or 133) such that when the group of memory cells (e.g., 131 or 133) is to be calibrated again within a time window (e.g., in response to a calibration command or a read command), the accumulated storage charge loss 213 can be retrieved according to the identification of the group of the memory cells (e.g., 131 or 133) to generate the index 217 for a coarse calibration.

The memory device 130 can store the accumulated storage charge loss 213 in association with a time gap responsible for the amount of accumulated storage charge loss 213. The time gap can be determined from the time difference between the last write performed on the group of memory cells (e.g., 131 or 133) and the measuring of the signal and noise characteristics 139 of the group of memory cells used to calculate the amount of accumulated storage charge loss 213 resulting from a similar temperature history.

Subsequently, when the group of the memory cells (e.g., 131 or 133) or another group is to be calibrated (e.g., in response to a calibration command or a read command), the current time gap responsible for accumulated storage charge loss can be compared to the time gap of the amount of accumulated storage charge loss 213. When the difference in the time gaps is lower than a threshold, the amount of accumulated storage charge loss 213 can be retrieved to generate the index 217 for a coarse calibration.

In general, the memory device 130 can store correlation data that identifies different amounts of accumulated storage charge loss (e.g., 213) for different time gaps responsible for the respective amounts of accumulated storage charge loss (e.g., 213). From such data, the memory device 130 can calculate an amount of accumulated storage charge loss 213 for a given time gap. When a group of memory cells (e.g., 131 or 133) or another group is to be calibrated (e.g., in response to a calibration command or a read command), the current time gap responsible for accumulated storage charge loss can be used to determine the current amount of accumulated storage charge loss 213 based on the correlation data. The current amount of accumulated storage charge loss 213 can be used to generate an index 217 for a coarse calibration.

A non-transitory computer storage medium can be used to store instructions of the firmware of a memory sub-system (e.g., 110). When the instructions are executed by the controller 115 and/or the processing device 117, the instructions cause the controller 115, the processing device 117, and/or a separate hardware module to perform the methods discussed above.

Figure 10:
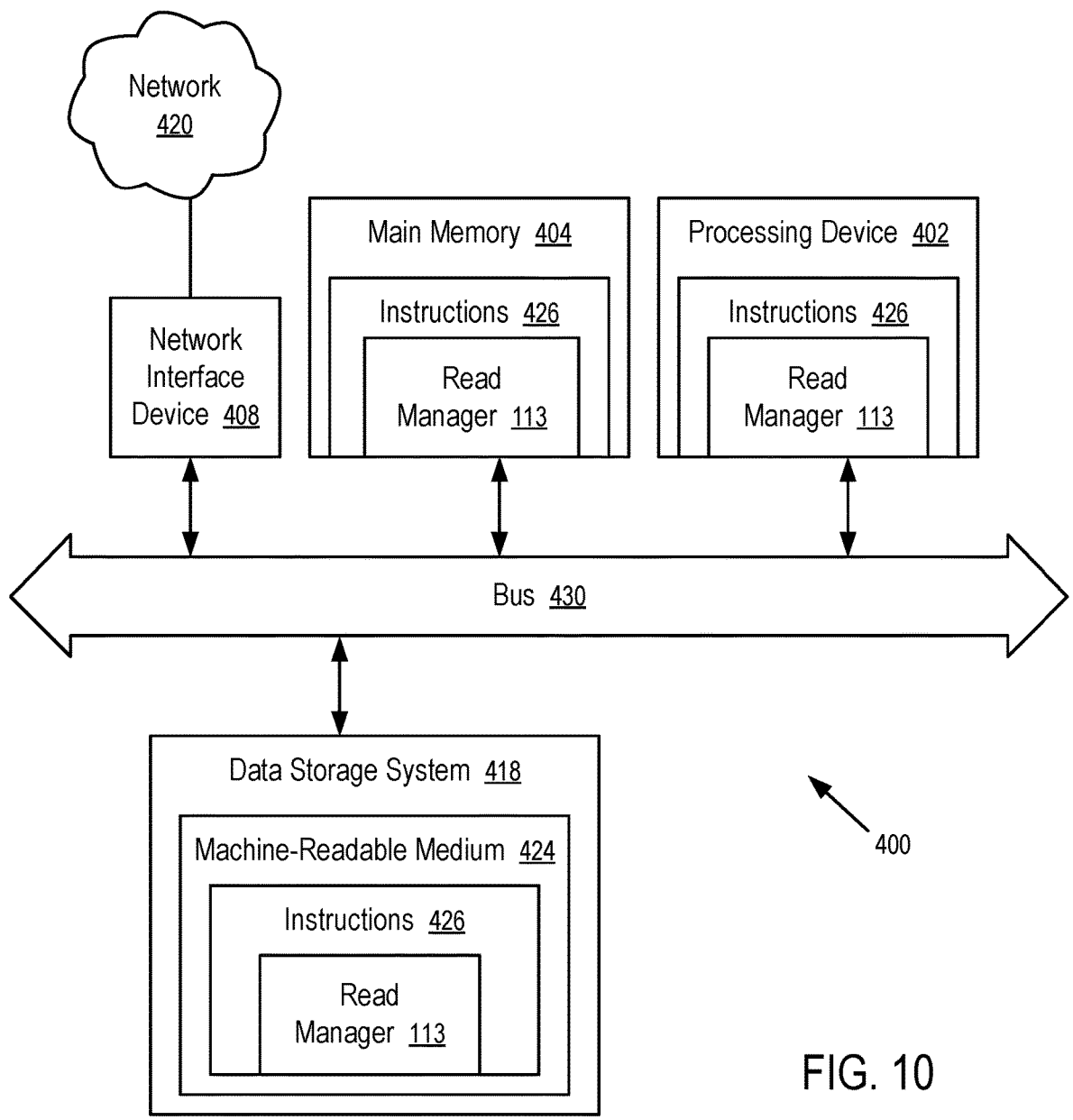
FIG. 10 is a block diagram of an example computer system in which embodiments of the present disclosure can operate.

FIG. 10 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a read manager 113 (e.g., to execute instructions to perform operations corresponding to the read manager 113 described with reference to FIGS. 1-9). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a read manager 113 (e.g., the read manager 113 described with reference to FIGS. 1-9). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:
    at least one group of memory cells;
    a first circuit configured to apply a plurality of first voltages to the memory cells and determine states of the memory cells responsive to the first voltages; and
    a second circuit configured to:
        determine, based on the states of the memory cells responsive to the first voltages, a statistical distribution of the memory cells over the first voltages;
        calculate, from the statistical distribution of the memory cells over the first voltages, an amount of accumulated storage charge loss in the memory cells; and
        determine, using the amount of accumulated storage charge loss, a second voltage to read the memory cells.

2. The device of claim 1, further configured to perform a read voltage calibration to determine the second voltage based on the amount of accumulated storage charge loss and a look up table.

3. The device of claim 2, wherein the statistical distribution includes a distribution of count difference over the first voltages; wherein each count difference at a voltage between a lower voltage and a higher voltage identifies a difference between a first count of first memory cells having a predetermined state when the higher voltage is applied and a second count of second memory cells having the predetermined state when the lower voltage is applied.

4. The device of claim 3, wherein the amount of accumulated storage charge loss is determined by a predictive model trained using a machine learning technique and having the distribution of count difference as an input.

5. The device of claim 4, wherein the second circuit is further configured to:
    determine a third voltage based on the distribution of count difference; and
    determine a third count of third memory cells having threshold voltages greater than the third read voltage;
    wherein the amount of accumulated storage charge loss is determined by the predictive model further having the third count as an input.

6. The device of claim 5, wherein the second circuit is configured to:
    determine an index, representative of a predetermined range of highest threshold voltage, from the amount of accumulated storage charge loss; and
    retrieve, using the index, an entry from the look up table to determine the second voltage.

7. The device of claim 6, wherein the second circuit is further configured to:
    determine, based on the entry retrieved from the look up table, a further statistical distribution of the group of memory cells; and
    determine the second voltage based on the further statistical distribution of the group of memory cells.

8. The device of claim 6, further configured to:
    store, in association with an identification of the group of memory cells, data representative of the amount of accumulated storage charge loss for read voltage calibration.

9. The device of claim 8, wherein the data representative of the amount of accumulated storage charge loss is stored further in association with a time period since a last write in the group of memory cells.

10. A method, comprising:
    applying a plurality of first voltages to a group of memory cells in a device;
    determining states of the memory cells responsive to the first voltages;
    determining, based on the states of the memory cells responsive to the first voltages, a statistical distribution of the memory cells over the first voltages;
    calculating, from the statistical distribution of the memory cells over the first voltages, an amount of accumulated storage charge loss in the memory cells; and
    determining, using the amount of accumulated storage charge loss, a second voltage to read the memory cells.

11. The method of claim 10, further comprising:
    performing a read voltage calibration to determine the second voltage based on the amount of accumulated storage charge loss and a look up table.

12. The method of claim 11, wherein the statistical distribution includes a distribution of count difference over the first voltages; wherein each count difference at a voltage between a lower voltage and a higher voltage identifies a difference between a first count of first memory cells having a predetermined state when the higher voltage is applied and a second count of second memory cells having the predetermined state when the lower voltage is applied.

13. The method of claim 12, wherein the amount of accumulated storage charge loss is determined by a predictive model trained using a machine learning technique and having the distribution of count difference as an input.

14. The method of claim 13, further comprising:
determining a third voltage based on the distribution of count difference; and
determining a third count of third memory cells having threshold voltages greater than the third read voltage;
wherein the amount of accumulated storage charge loss is determined by the predictive model further having the third count as an input.

15. The method of claim 14, further comprising:
determining an index, representative of a predetermined range of highest threshold voltage, from the amount of accumulated storage charge loss; and
retrieving, using the index, an entry from the look up table to determine the second voltage.

16. The method of claim 15, further comprising:
determining, based on the entry retrieved from the look up table, a further statistical distribution of the group of memory cells; and
determining the second voltage based on the further statistical distribution of the group of memory cells.

17. The method of claim 15, further comprising:
storing, in association with an identification of the group of memory cells, data representative of the amount of accumulated storage charge loss for read voltage calibration.

18. The method of claim 17, wherein the data representative of the amount of accumulated storage charge loss is stored further in association with a time period since a last write in the group of memory cells.

19. A memory sub-system, comprising:
a processing device; and
at least one memory device, the memory device having a group of memory cells formed on an integrated circuit die;
wherein the processing device is configured to transmit, to the memory device, a read command with an address identifying the memory cells;
wherein in response to the read command, the memory device is configured to:
apply a plurality of first voltages to the memory cells to determine states of the memory cells responsive to the first voltages;
determine, based on the states of the memory cells responsive to the first voltages, a first statistical distribution of the memory cells over the first voltages, wherein the first statistical distribution includes a distribution of count difference over the first voltages, and wherein each count difference at a voltage between a lower voltage and a higher voltage identifies a difference between a first count of first memory cells having a predetermined state when the higher voltage is applied and a second count of second memory cells having the predetermined state when the lower voltage is applied;
calculate, from the first statistical distribution of the memory cells over the first voltages, an amount of accumulated storage charge loss in the memory cells; and
determine, using the amount of accumulated storage charge loss, a second voltage to read the memory cells.

20. The memory sub-system of claim 19, wherein the memory device is further configured to:
determine a third voltage based on the distribution of count difference;
determine a third count of third memory cells having threshold voltages greater than the third read voltage;
calculate, using a predictive model having the distribution of count difference and the third count as input, the amount of accumulated storage charge loss;
determine an index, representative of a predetermined range of highest threshold voltage, from the amount of accumulated storage charge loss;
retrieve, using the index, an entry from a look up table;
determine, based on the entry retrieved from the look up table, a second statistical distribution of the group of memory cells; and
determine the second voltage based on the second statistical distribution of the group of memory cells.

* * * * *